US010453867B2

(12) United States Patent
Lee

(10) Patent No.: US 10,453,867 B2
(45) Date of Patent: Oct. 22, 2019

(54) DISPLAY APPARATUS HAVING CLOCK LINE

(71) Applicant: Samsung Display Co., Ltd., Yongin-Si, Gyeonggi-Do (KR)

(72) Inventor: Chang-soo Lee, Suwon-si (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 15/905,327

(22) Filed: Feb. 26, 2018

(65) Prior Publication Data

US 2019/0013332 A1 Jan. 10, 2019

(30) Foreign Application Priority Data

Jul. 4, 2017 (KR) .................. 10-2017-0085068

(51) Int. Cl.
*H01L 27/12* (2006.01)
*H01L 21/768* (2006.01)
*G02F 1/1368* (2006.01)
*H01L 27/32* (2006.01)
*G02F 1/1362* (2006.01)

(52) U.S. Cl.
CPC ...... *H01L 27/124* (2013.01); *H01L 21/76894* (2013.01); *H01L 27/1259* (2013.01); *H01L 27/1296* (2013.01); *G02F 1/1368* (2013.01); *G02F 1/136286* (2013.01); *G02F 2001/13629* (2013.01); *H01L 27/3223* (2013.01); *H01L 27/3276* (2013.01); *H05K 2201/0979* (2013.01); *H05K 2201/09409* (2013.01); *H05K 2201/09781* (2013.01)

(58) Field of Classification Search
CPC ...... H01L 27/3223; H05K 2201/09781; H05K 2201/09409; H05K 2201/0979
See application file for complete search history.

(56) References Cited

U.S. PATENT DOCUMENTS

| 5,398,262 | A | * | 3/1995 | Ahuja | ............. | G06F 1/10 |
| | | | | | | 327/258 |
| 6,448,948 | B1 | * | 9/2002 | Friedman | ......... | G09G 3/22 |
| | | | | | | 345/74.1 |
| 7,466,312 | B2 | | 12/2008 | Choi et al. | | |
| 8,558,776 | B2 | | 10/2013 | Lee et al. | | |
| 2001/0042921 | A1 | * | 11/2001 | Mori | ............. | H01L 23/528 |
| | | | | | | 257/758 |
| 2006/0050205 | A1 | * | 3/2006 | Yang | ......... | G02F 1/133514 |
| | | | | | | 349/98 |

(Continued)

FOREIGN PATENT DOCUMENTS

| KR | 10-0555528 B1 | 2/2006 |
| KR | 10-1365055 B1 | 2/2014 |

(Continued)

*Primary Examiner* — Ngan V Ngo
(74) *Attorney, Agent, or Firm* — Innovation Counsel LLP

(57) ABSTRACT

A display apparatus includes a first clock line providing a first clock signal and a second clock line providing a second clock signal. The first clock line includes a first main clock line and a first dummy clock line extending from the first main clock line, the second clock line includes a second main clock line and a second dummy clock line extending from the second main clock line, and the first dummy clock line and the second dummy clock line have different areas from each other.

18 Claims, 20 Drawing Sheets

(56) References Cited

U.S. PATENT DOCUMENTS

| | | | | |
|---|---|---|---|---|
| 2006/0227094 A1* | 10/2006 | Park | ............... | G09G 3/3677 345/100 |
| 2007/0255983 A1* | 11/2007 | Funaba | ............... | G11C 5/04 714/724 |
| 2011/0089575 A1* | 4/2011 | Lee | ............... | H01L 23/16 257/777 |
| 2012/0293467 A1* | 11/2012 | Lee | ............... | G09G 3/3677 345/204 |
| 2015/0123884 A1* | 5/2015 | Kim | ............... | G09G 3/006 345/77 |
| 2016/0070147 A1* | 3/2016 | Kim | ............... | G09G 3/3655 345/96 |
| 2016/0071790 A1* | 3/2016 | Chen | ............... | H01L 23/528 257/773 |
| 2016/0140896 A1* | 5/2016 | Kwon | ............... | G09G 3/3225 345/76 |
| 2016/0183366 A1* | 6/2016 | Ishida | ............... | H05K 1/118 361/749 |
| 2016/0204181 A1* | 7/2016 | So | ............... | H01L 27/3276 257/40 |
| 2016/0321983 A1* | 11/2016 | Kim | ............... | G09G 3/2092 |
| 2017/0003804 A1* | 1/2017 | Sung | ............... | G06F 3/0412 |
| 2017/0125451 A1* | 5/2017 | Kang | ............... | H01L 24/05 |
| 2017/0193953 A1* | 7/2017 | Kim | ............... | G09G 3/3674 |
| 2018/0151660 A1* | 5/2018 | Kim | ............... | H01L 27/3223 |
| 2018/0211982 A1* | 7/2018 | Wang | ............... | H01L 27/1244 |
| 2018/0240856 A1* | 8/2018 | Kim | ............... | H01L 27/3276 |

FOREIGN PATENT DOCUMENTS

| | | |
|---|---|---|
| KR | 10-2016-0001802 A | 1/2016 |
| KR | 10-2017-0038415 A | 4/2017 |

\* cited by examiner

DISPLAY APPARATUS HAVING CLOCK LINE

CROSS-REFERENCE TO RELATED APPLICATION

This U.S. non-provisional patent application claims priority under 35 U.S.C. § 119 of Korean Patent Application No. 10-2017-0085068, filed on Jul. 4, 2017, the contents of which are hereby incorporated by reference in its entirety.

BACKGROUND

1. Field of Disclosure

The present disclosure relates to a display apparatus having a clock line.

2. Description of the Related Art

A display apparatus includes gate lines, data lines, and pixels connected to the gate lines and the data lines. The display apparatus includes a gate driving circuit to apply gate signals to the gate lines and a data driving circuit to apply data signals to the data lines.

The gate driving circuit receives clock signals through clock lines and outputs the gate signals to the gate lines. The clock lines are arranged in a non-display area of a display substrate to be adjacent to the gate driving circuit.

SUMMARY

The present disclosure provides a display apparatus capable of minimizing a difference in characteristics between the clock lines.

Embodiments of the inventive concept provide a display apparatus including a display panel including a display area and a non-display area, the display area comprising a plurality of pixels, a gate driving circuit disposed in the non-display area and configured to apply a plurality of gate signals to the pixels to drive the pixels, a first clock line disposed in the non-display area and configured to apply a first clock signal to the gate driving circuit, and a second clock line disposed in the non-display area and configured to apply a second clock signal to the gate driving circuit. The first clock line includes a first main clock line and a first dummy clock line extending from the first main clock line, the second clock line includes a second main clock line and a second dummy clock line extending from the second main clock line, and the first dummy clock line and the second dummy clock line have different areas from each other.

At least one of the first dummy clock line and the second dummy clock line is cut by a laser cutting process such that the first dummy clock line and the second dummy clock line have different areas from each other.

The first main clock line extends in a first direction, the first dummy clock line extends in the first direction from the first main clock line, the second main clock line extends in the first direction, and the second dummy clock line extends in the first direction from the second main clock line.

The first clock line and the second clock line are arranged in a second direction substantially perpendicular to the first direction and spaced apart from each other by a predetermined distance.

At least a portion of each of the first dummy clock line and the second dummy clock line has a spiral shape.

Each of the first dummy clock line and the second dummy clock line has a line width smaller than a line width of the first main clock line and the second main clock line.

At least a portion of each of the first dummy clock line and the second dummy clock line has one or a combination of a spiral shape, a polygonal shape, a circular shape, and a zigzag shape.

Each of the pixels includes a substrate, a semiconductor layer disposed on the substrate, a gate insulating layer covering the semiconductor layer, a gate electrode disposed on the gate insulating layer, an interlayer insulating layer disposed on the gate electrode, a source electrode disposed on the interlayer insulating layer, and a drain electrode disposed on the interlayer insulating layer.

The first main clock line, the first dummy clock line, the second main clock line, the second dummy clock line, and the gate electrode are substantially simultaneously formed on the substrate using a same material.

The display apparatus further includes an insulating layer disposed on the first main clock line and the second main clock line. The first main clock line and the second main clock line are disposed on the substrate, the first dummy clock line makes contact with the first main clock line through a first contact hole defined through the insulating layer, and the second dummy clock line makes contact with the second main clock line through a second contact hole defined through the insulating layer.

The first dummy clock line, the second dummy clock line, the source electrode, and the drain electrode are formed substantially simultaneously using a same material.

The display apparatus further includes an insulating layer disposed on the first main clock line and the second main clock line, a first dummy line disposed on the insulating layer, an interlayer insulating layer disposed on the first dummy line, and a second dummy line disposed on the interlayer insulating layer. The first main clock line and the second main clock line are disposed on the substrate, the first dummy line makes contact with the first main clock line through a first contact hole defined through the insulating layer, the second dummy line makes contact with the first dummy line through a second contact hole defined through the interlayer insulating layer, the first dummy clock line includes the first dummy line and the second dummy line, and the second dummy clock line makes contact with the second main clock line through a third contact hole defined through the insulating layer.

Each of the pixels further includes a protective layer covering the source electrode and the drain electrode and a pixel electrode disposed on the protective layer. The first dummy line is simultaneously formed with the source electrode and the drain electrode of each of the pixels using a same material, and the second dummy line is substantially simultaneously formed with the pixel electrode of each of the pixels using a same material.

Embodiments of the inventive concept provide a display panel including a first clock line extending in a first direction and configured to provide a first clock signal and a second clock line extending in the first direction and configured to provide a second clock signal. The first clock line includes a first main clock line and a first dummy clock line extending from the first main clock line, the second clock line includes a second main clock line and a second dummy clock line extending from the second main clock line, and the first dummy clock line and the second dummy clock line have different areas from each other.

Each of the first dummy clock line and the second dummy clock line has a line width smaller than a line width of the first main clock line and the second main clock line.

At least a portion of each of the first dummy clock line and the second dummy clock line has one or a combination of a spiral shape, a polygonal shape, a circular shape, and a zigzag shape.

The first main clock line, the second main clock line, the first dummy clock line, and the second dummy clock line are substantially simultaneously formed using a same material.

The display apparatus further includes a substrate; and an insulating layer disposed on the first main clock line and the second main clock line, wherein the first main clock line and the second main clock line are disposed on the substrate, the first dummy clock line makes contact with the first main clock line through a first contact hole defined through the insulating layer, and the second dummy clock line makes contact with the second main clock line through a second contact hole defined through the insulating layer.

The display apparatus further includes a substrate; an insulating layer disposed on the first main clock line and the second main clock line; a first dummy line disposed on the insulating layer; an interlayer insulating layer disposed on the first dummy line; and a second dummy line disposed on the interlayer insulating layer, wherein the first main clock line and the second main clock line are disposed on the substrate, the first dummy line makes contact with the first main clock line through a first contact hole defined through the insulating layer, the second dummy line makes contact with the first dummy line through a second contact hole defined through the interlayer insulating layer, the first dummy clock line comprises the first dummy line and the second dummy line, and the second dummy clock line makes contact with the second main clock line through a third contact hole defined through the insulating layer.

According to the above, the display apparatus includes the first clock line including the first dummy clock line and the second clock line including the second dummy clock line. The first dummy clock line and the second dummy clock line have different areas from each other to compensate for the difference in characteristics between the first clock line and the second clock line. Accordingly, a load difference between the first clock signal transmitted through the first clock line and the second clock signal transmitted through the second clock line may be reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
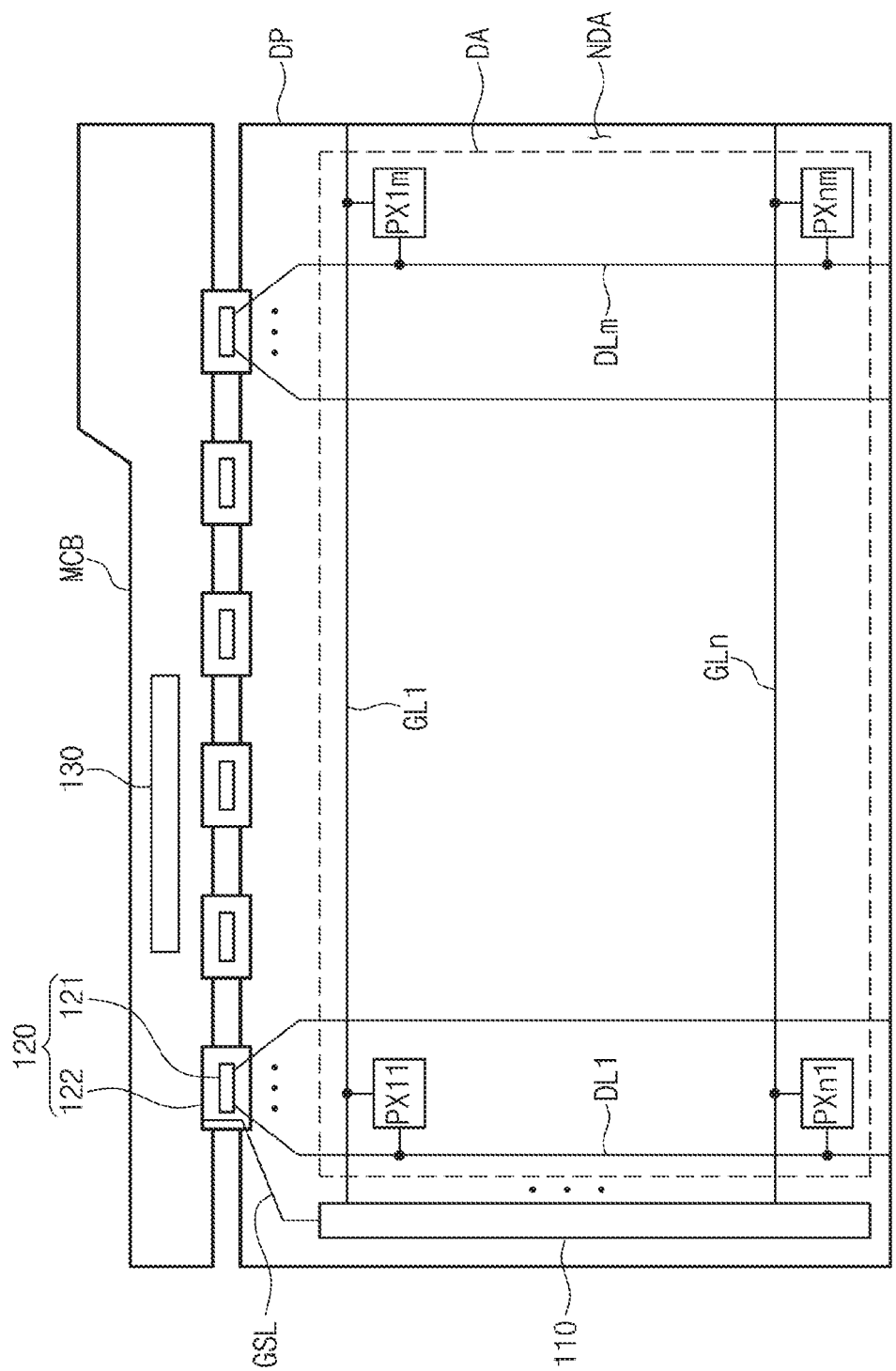
FIG. 1 is a plan view showing a display apparatus according to an exemplary embodiment of the present disclosure.

Hereinafter, the present invention will be explained in detail with reference to the accompanying drawings.

In the following descriptions, the same reference numerals may be used to denote parts, components, blocks, circuits, units, or modules, which have the same or similar functions as each other, over two or more drawings. However, this usage is for simplicity of explanation and ease of discussion only and does not imply that the configurations or structural details of the components or units are the same in all embodiments. Also, the commonly referenced parts/modules should not be taken as the only way to implement the teachings of the specific embodiments disclosed herein.

FIG. 1 is a plan view showing a display apparatus according to an exemplary embodiment of the present disclosure.

Referring to FIG. 1, the display apparatus according to the exemplary embodiment of the present disclosure includes a display substrate DP, a gate driving circuit 110, a data driving circuit 120, and a driving controller 130.

The display substrate DP should not be particularly limited. For instance, the display substrate DP may include various display panels, e.g., a liquid crystal display panel, an organic light emitting display panel, an electrophoretic display panel, an electrowetting display panel, etc.

When viewed in a plan view, the display substrate DP includes a display area DA in which a plurality of pixels PX11 to PXnm is arranged and a non-display area DA surrounding the display area DA.

The display substrate DP includes a plurality of gate lines GL1 to GLn and a plurality of data lines DL1 to DLm crossing the gate lines GL1 to GLn. The gate lines GL1 to GLn are connected to the gate driving circuit 110. The data lines DL1 to DLm are connected to the data driving circuit 120. FIG. 1 shows some gate lines among the gate lines GL1 to GLn and some data lines among the data lines DL1 to DLm.

FIG. 1 shows some pixels among the pixels PX11 to PXnm Each of the pixels PX11 to PXnm is connected to a corresponding gate line among the gate lines GL1 to GLn and a corresponding data line among the data lines DL1 to DLm.

The pixels PX11 to PXnm may be classified into a plurality of groups depending on a color displayed thereby. The pixels PX11 to PXnm may display one of primary colors. The primary colors include a red color, a green color, a blue color, and a white color, but the primary colors should not be limited thereto or thereby. That is, the primary colors may further include a variety of colors, such as a yellow color, a cyan color, a magenta color, etc.

The gate driving circuit 110 and the data driving circuit 120 receive control signals from the driving controller 130. The driving controller 130 is mounted on a main circuit board MCB. The driving controller 130 receives image data and control signals from an external graphic controller (not shown). The control signals include a vertical synchronization signal serving as a signal to distinct frame periods, a horizontal synchronization signal serving as a row distinction signal to distinct horizontal periods, a data enable signal maintained at a high level during a period, in which data are output, to indicate a data input period, and clock signals.

The gate driving circuit 110 generates gate signals in response to the control signal (hereinafter, referred to as a "gate control signal") provided from the driving controller 130 through a signal line GSL during the frame periods and applies the gate signals to the gate lines GL1 to GLn. The gate driving circuit 110 may be substantially simultaneously formed together with the pixels PX11 to PXnm through a thin film process. For instance, the gate driving circuit 110 may be mounted on the non-display area NDA in an oxide semiconductor TFT gate driver circuit (OSG) form. According to another embodiment, the gate driving circuit 110 may include a driving chip (not shown) and a flexible circuit board (not shown) on which the driving chip is mounted. In this case, the flexible circuit board is electrically connected to the main circuit board MCB. According to another embodiment, the gate driving circuit 110 may be mounted on the non-display area NDA of the display substrate DP in a chip-on-glass (COG) form.

FIG. 1 shows one gate driving circuit 110 connected to left ends of the gate lines GL1 to GLn as a representative example. According to another embodiment, the display apparatus may include two gate driving circuits. One gate driving circuit of the two gate driving circuits is connected to the left ends of the gate lines GL1 to GLn, and the other gate driving circuit of the two gate driving circuits is connected to right ends of the gate lines GL1 to GLn. In addition, one gate driving circuit of the two gate driving circuits is connected to odd-numbered gate lines of the gate lines GL1 to GLn, and the other gate driving circuit of the two gate driving circuits is connected to even-numbered gate lines of the gate lines GL1 to GLn.

The data driving circuit 120 generates grayscale voltages corresponding to the image data provided from the driving controller 130 in response to the control signal (hereinafter, referred to as a "data control signal") provided from the driving controller 130. The data driving circuit 120 applies the grayscale voltages to the data lines DL1 to DLm as data voltages.

The data voltages include positive (+) data voltages having a positive polarity with respect to a common voltage and/or negative (−) data voltages having a negative polarity with respect to the common voltage. Some data voltages of the data voltages applied to the data lines DL1 to DLm during each horizontal period HP have the positive polarity, and the other data voltages of the data voltages applied to the data lines DL1 to DLm during each horizontal period HP have the negative polarity. The polarity of the data voltages is inverted according to the frame periods to prevent liquid crystals from burning and deteriorating. The data driving circuit 120 generates the data voltages inverted in the unit of frame period in response to an inversion signal.

The data driving circuit 120 includes a driving chip 121 and a flexible circuit board 122 on which the driving chip 121 is mounted. The driving chip 121 may be provided in a plural number. The flexible circuit board 122 electrically connects the main circuit board MCB and the display substrate DP. Each of the driving chips 121 applies a corresponding data signal of a plurality of data signals to a corresponding data line of the data lines DL1 to DLm.

In FIG. 1, the data driving circuit 120 is provided in a tape carrier package (TCP) form, but it should not be limited thereto or thereby. According to another embodiment, the data driving circuit 120 may be mounted on the non-display area NDA of the display substrate DP in a chip-on-glass (COG) form.

Each of the pixels PX11 to PXnm includes a thin film transistor and a liquid crystal capacitor. Each of the pixels PX11 to PXnm may further include a storage capacitor.

A pixel PXij is electrically connected to an i-th gate line GLi and a j-th data line DLj. The pixel PXij outputs a pixel image corresponding to the data signal provided from the j-th data line DLj in response to the gate signal provided from the i-th gate line GLi.

Figure 2:
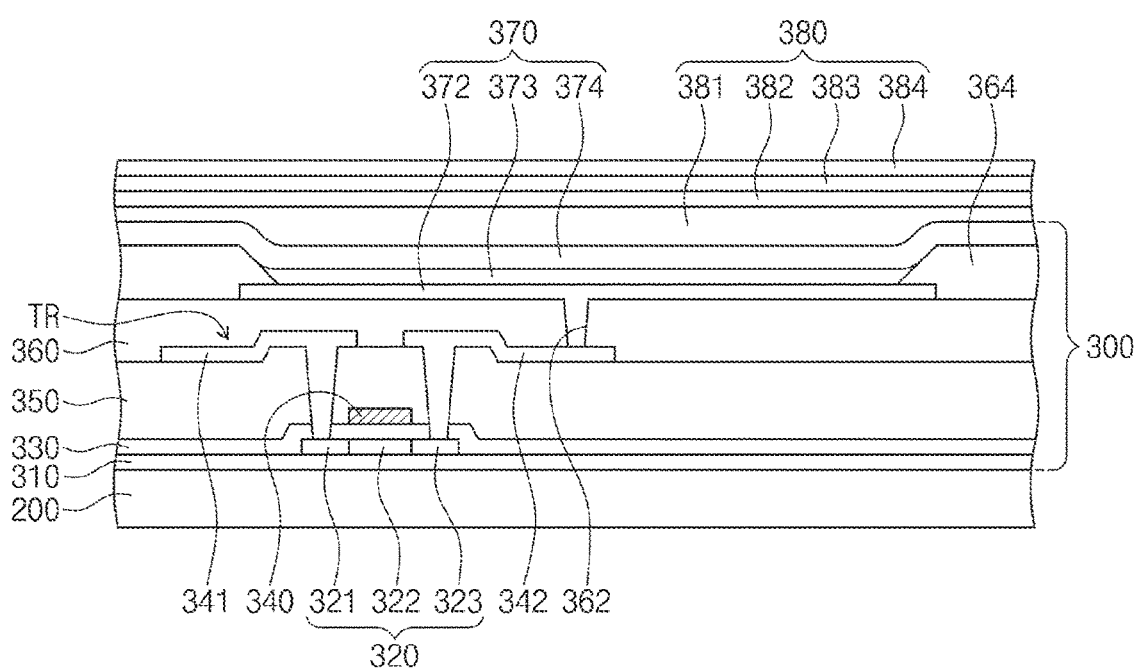
FIG. 2 is an enlarged cross-sectional view showing a portion of a display area of a display substrate shown in FIG. 1.

FIG. 2 is an enlarged cross-sectional view showing a portion of the display area DA of the display substrate DP shown in FIG. 1.

Referring to FIG. 2, the display substrate DP shown in FIG. 1 includes a substrate 200, a display part 300 disposed on the substrate 200, a thin film encapsulation layer 380 disposed above the display part 300 to encapsulate the display part 300.

The substrate 200 may be formed by using various materials. For instance, the substrate 200 may be formed using a glass material, an insulating material, or a metal thin film layer. Selectively, the substrate 200 may be formed using a flexible material. For example, the substrate 200 may include an organic material.

The substrate 200 may include at least one of silicone-based polymer, polyurethane, polyurethane acrylate, acrylate polymer, andacrylate terpolymer. Here, the silicone-based polymer may include, for example, polydimethylsiloxane (PDMS), hexamethyldisiloxane (HMDSO), or the like.

A buffer layer 310 may be disposed on the substrate 200. The buffer layer 310 may have a single-layer structure of silicon nitride (SiNx) or a two-layer structure of silicon nitride (SiNx) and silicon oxide (SiO2). The buffer layer 310 may prevent an unnecessary substance, e.g., impurity, moisture, etc., from entering the substrate 200 and planarize an upper portion of the substrate 200.

A transistor TR may be disposed on the buffer layer 310. A semiconductor layer 320 is disposed on the buffer layer 310. The semiconductor layer 320 includes a polycrystalline silicon and includes a channel area 322, a source area 321, and a drain area 323. The source area 321 and the drain area 323 are disposed at both sides of the channel area 322. A gate insulating layer 330 is disposed on the semiconductor layer 320. The gate insulating layer 330 may have a single-layer structure or a multi-layer structure, which includes at least one of silicon nitride and silicon oxide. The gate insulating layer 330 insulates the semiconductor layer 320 from a gate electrode 340 disposed thereon.

The gate electrode 340 of the transistor TR is disposed on the gate insulating layer 330. The gate electrode 340 is disposed on the gate insulating layer 330 to overlap with the channel area 322 of the semiconductor layer 320. According to another embodiment, the gate electrode 340 may have a two-layer structure of a gate lower electrode and a gate upper electrode. The gate electrode 340 may be formed by a photolithography process and an etching process.

The gate electrode 340 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

An interlayer insulating layer 350 is disposed above the gate electrode 340. The interlayer insulating layer 350 includes an inorganic material. For instance, the interlayer insulating layer 350 includes a metal oxide material or a metal nitride material, e.g., silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), zirconium oxide (ZrO2), or the like.

The interlayer insulating layer 350 may have a single-layer structure or a multi-layer structure of an inorganic material, such as silicon oxide (SiOx) and/or silicon nitride (SiNx). According to embodiments, the interlayer insulating layer 350 may have a two-layer structure of SiOx/SiNy or SiNx/SiOy.

The interlayer insulating layer 350 is provided with contact holes defined therethrough to respectively expose the source area 321 and the drain area 323 of the semiconductor layer 320.

A source electrode 341 connected to the source area 321 of the semiconductor layer 320 and a drain electrode 342 connected to the drain electrode 323 of the semiconductor layer 320 are disposed on the interlayer insulating layer 350.

Each of the source electrode 341 and the drain electrode 342 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A protective layer 360 including an inorganic material or an organic material is disposed above the transistor TR. In the case that the protective layer 360 includes the organic material, an upper surface thereof may be flat. The protective layer 360 may include an insulating material. For instance, the protective layer 360 may have a single-layer structure or a multi-layer structure of the inorganic material, the organic material, or an organic/inorganic composite material and may be formed by various deposition methods.

An organic light emitting element 370 is disposed above the protective layer 360. The organic light emitting element 370 includes a pixel electrode 372, an organic light emitting layer 373, and a common electrode 374. The organic light emitting element 370 may further include a pixel definition layer 364.

A contact hole 362 is formed through the protective layer 360 to expose a portion of the transistor TR. The pixel electrode 372 is disposed on the protective layer 360. The pixel electrode 372 makes contact with the drain electrode 342 of the transistor TR through the contact hole 362. The pixel electrode 372 may include a reflective electrode and a transmissive electrode formed on the reflective electrode. The reflective electrode may include a metal material having high reflectance, e.g., silver (Ag), aluminum (Al), or an alloy thereof, and the transmissive electrode may include a transparent conductive material, e.g., indium tin oxide (ITO), indium zinc oxide (IZO), etc.

The pixel definition layer 364 is disposed on the protective layer 360 to cover an edge of the pixel electrode 372.

The organic light emitting layer 373 is disposed on the pixel electrode 372, and the common electrode 374 is disposed on the organic light emitting layer 373 and the pixel definition layer 364.

The organic light emitting layer 373 may include a light emitting layer (not shown) from which a light is substantially emitted and organic layers (not shown) used to effectively transmit carriers of holes or electrons to the light emitting layer. The organic layers include a hole injection layer and a hole transport layer, which are disposed between the pixel electrode 372 and the light emitting layer, and an electron injection layer and an electron transport layer, which are disposed between the common electrode 374 and the light emitting layer.

The thin film encapsulation layer 380 is disposed on the common electrode 374. The thin film encapsulation layer 380 encapsulates and protects the organic light emitting element 370 above the buffer layer 310 from the outside environment.

The thin film encapsulation layer 380 includes organic encapsulation layers 381 and 383 and inorganic encapsulation layers 382 and 384 alternately stacked with the encapsulation organic layers 381 and 383. FIG. 2 shows the thin film encapsulation layer 380 in which the organic encapsulation layers 381 and 383 and the inorganic encapsulation layers 382 and 384 are alternately stacked one by one, but the structure of the thin film encapsulation layer 380 should not be limited thereto or thereby. For instance, the thin film encapsulation layer 380 may have a structure in which the inorganic encapsulation layer, the organic encapsulation layer, and the inorganic encapsulation layer are sequentially stacked. In this case, the organic encapsulation layer may have a thickness greater than a thickness of the inorganic encapsulation layer.

Figure 3:
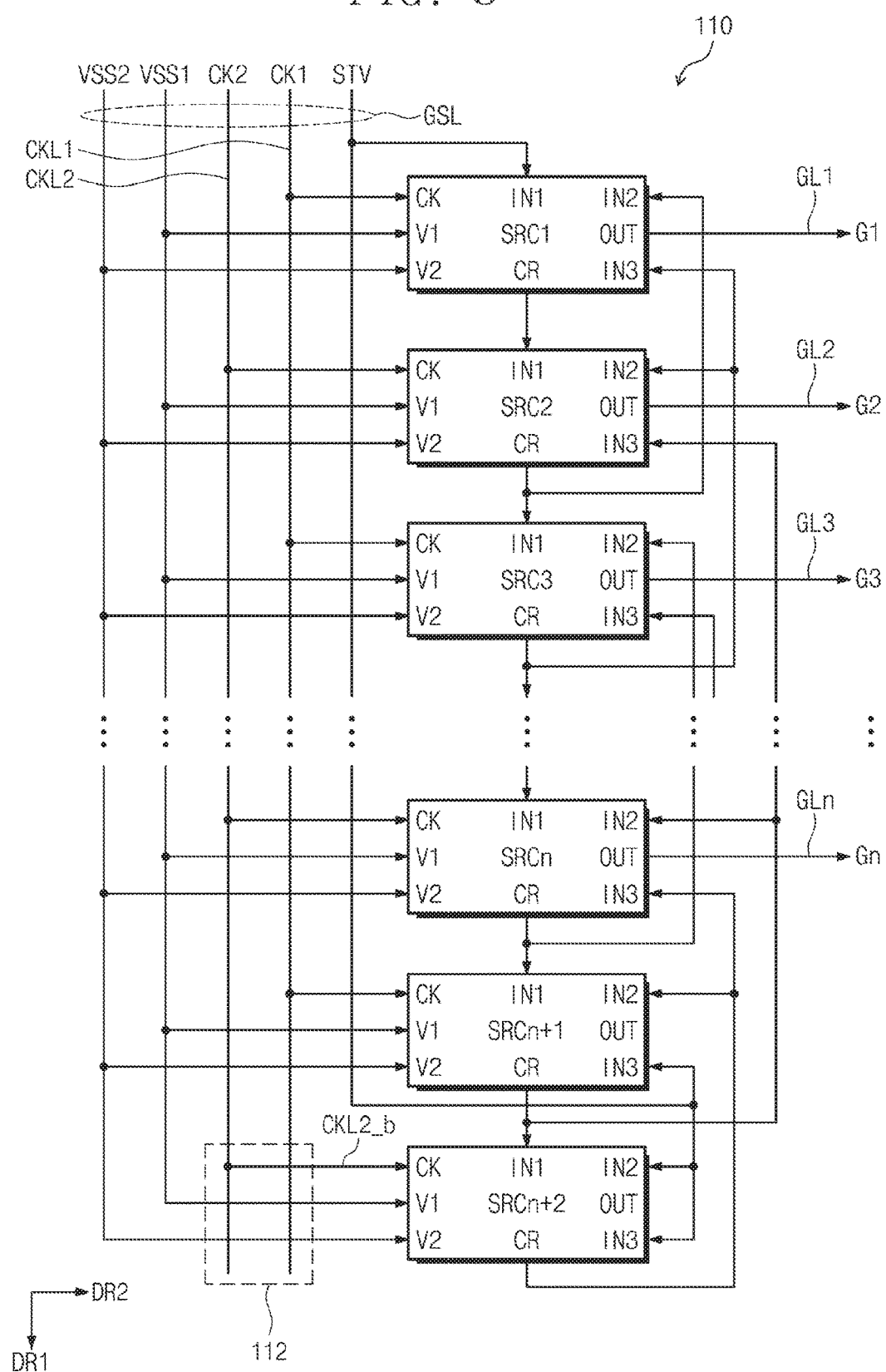
FIG. 3 is a block diagram showing a gate driving circuit according to an exemplary embodiment of the present disclosure.

FIG. 3 is a block diagram showing the gate driving circuit according to an exemplary embodiment of the present disclosure.

Referring to FIG. 3, the gate driving circuit 110 includes a plurality of driving stages SRC1 to SRCn and dummy driving stages SRCn+1 and SRCn+2. The driving stages SRC1 to SRCn and the dummy driving stages SRCn+1 and SRCn+2 are connected to each other one after another to allow each driving stage to be driven in response to a carry signal output from a previous driving stage and a carry signal output from a next driving stage.

Each of the driving stages SRC1 to SRCn and the dummy driving stages SRCn+1 and SRCn+2 receives a first clock signal CK1 or a second clock signal CK2, a first voltage VSS1, and a second voltage VSS2 from the driving controller 130 shown in FIG. 1. Each of a first driving stage SRC1 and the dummy driving stages SRCn+1 and SRCn+2 further receives a start signal STV.

The first and second clock signals CK1 and CK2 may be applied to the driving stages SRC1 to SRCn through first and second clock lines CKL1 and CKL2 extending in a first direction DR1.

In the exemplary embodiment shown in FIG. 3, the gate driving circuit 110 receives two clock signals, e.g., the first and second clock signals CK1 and CK2, but the gate driving circuit 110 may receive three or more clock signals.

In the present exemplary embodiment, the driving stages SRC1 to SRCn are connected to the gate lines GL1 to GLn, respectively. The driving stages SRC1 to SRCn apply the gate signals to the gate lines GL1 to GLn, respectively. In the present exemplary embodiment, the gate lines connected to the driving stages SRC1 to SRCn may be odd-numbered gate lines or even-numbered gate lines among the gate lines GL1 to GLn.

Each of the driving stages SRC1 to SRCn and the dummy driving stages SRCn+1 and SRCn+2 includes a first input terminal IN1, a second input terminal IN2, a third input terminal IN3, a gate output terminal OUT, a carry output terminal CR, a clock terminal CK, a first power terminal V1, and a second power terminal V2.

The gate output terminal OUT of each of the driving stages SRC1 to SRCn is connected to a corresponding gate line of the gate lines GL1 to GLn. The gate signals generated by the driving stages SRC1 to SRCn are applied to the gate lines GL1 to GLn through the gate output terminals OUT.

The carry output terminal CR of each of the driving stages SRC1 to SRCn is electrically connected to the first input terminal IN1 of the next driving stage of the corresponding driving stage. In addition, the carry output terminal CR of each of the driving stages SRC2 to SRCn is electrically connected to the second input terminal IN2 of the previous driving stage. For instance, the carry output terminal CR of a k-th driving stage of the driving stages SRC1 to SRCn is connected to the second input terminal IN2 of a (k−1)th driving stage SRCk−1, the first input terminal IN1 of a (k+1)th driving stage SRCk+1, and the third input terminal IN3 of a (k−2)th driving stage SRCk−2. The carry output terminal CR of each of the driving stages SRC1 to SRCn and the dummy driving stages SRCn+1 and SRCn+2 outputs the carry signal.

The first input terminal IN1 of each of the driving stages SRC2 to SRCn and the dummy stages SRCn+1 and SRCn+2 receives the carry signal from the previous driving stage of the corresponding driving stage. For instance, the first input terminal IN1 of the k-th driving stage SRCk receives the carry signal output from the (k−1)th driving stage SRCk−1. Among the driving stages SRC1 to SRCn, the first input terminal IN1 of the first driving stage SRC1 receives the start signal STV from the driving controller 130 shown in FIG. 1 instead of the carry signal of the previous driving stage.

The second input terminal IN2 of each of the driving stages SRC1 to SRCn receives the carry signal from the carry output terminal CR of the next driving stage of the corresponding driving stage. For instance, the second input terminal IN2 of the k-th driving stage SRCk receives the carry signal output from the carry output terminal CR of the (k+1)th driving stage SRCk+1. According to another embodiment, the second input terminal IN2 of each of the driving stages SRC1 to SRCn may be electrically connected to the gate output terminal OUT of the next driving stage of the corresponding driving stage. The second input terminal IN2 of the driving stage SRCn receives the carry signal CRn+1 output from the carry output terminal CR of the dummy driving stage SRCn+1.

The third input terminal IN3 of each of the driving stages SRC1 to SRCn receives the carry signal from the carry output terminal CR of the driving stage after the next driving stage of the corresponding driving stage. For instance, the third input terminal IN3 of the k-th driving stage SRCk receives the carry signal output from the carry output terminal CR of the (k+2)th driving stage SRCk+2. According to another embodiment, the third input terminal IN3 of the k-th driving stage SRCk may be electrically connected to the gate output terminal OUT of the (k+2)th driving stage SRCk+2. The second input terminal IN2 of the driving stage SRCn receives the carry signal output from the carry output terminal CR of the dummy driving stage SRCn+1. The third input terminal IN3 of the driving stage SRCn receives the carry signal output from the carry output terminal CR of the dummy driving stage SRCn+2.

The clock terminal CK of each of the driving stages SRC1 to SRCn receives the first clock signal CK1 or the second clock signal CK2. The clock terminals CK of the odd-numbered driving stages SRC1, SRC3, SRCn−1 among the driving stages SRC1 to SRCn receive the first clock signal CK1. The clock terminals CK of the even-numbered driving stages SRC2, SRC4, SRCn among the driving stages SRC1 to SRCn receive the second clock signal CK2. The first and second clock signals CK1 and CK2 have different phases from each other.

The first power terminal V1 of each of the driving stages SRC1 to SRCn receives the first voltage VSS1, and the second power terminal V2 of each of the driving stages SRC1 to SRCn receives the second voltage VSS2. The first and second voltages VSS1 and VSS2 have different voltage levels from each other, and the second voltage VSS2 has a voltage level lower than that of the first voltage VSS1.

In each of the driving stages SRC1 to SRCn according to the present exemplary embodiment, one of the first input terminal IN1, the second input terminal IN2, the gate output terminal OUT, the carry output terminal CR, the clock terminal CK, the first power terminal V1, and the second power terminal V2 may be omitted or another terminal may further be added to each of the driving stages SRC1 to SRCn. For instance, one of the first and second power terminals V1 and V2 may be omitted. In this case, each of the driving stages SRC1 to SRCn receives only one of the first voltage VSS1 and the second voltage VSS2. In addition, a connection relation between the driving stages SRC1 to SRCn may be changed.

Figure 4A:
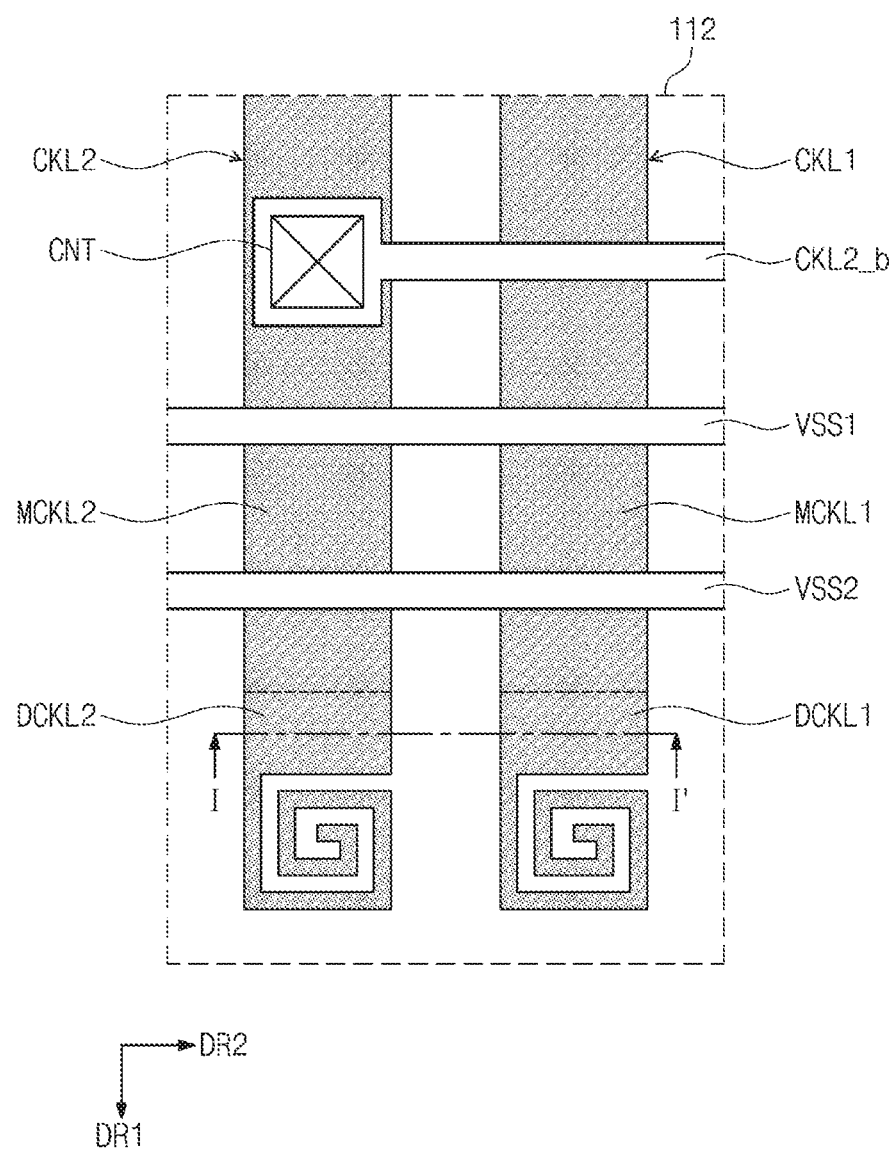
FIG. 4A is an enlarged plan view showing a portion of first and second clock lines shown in FIG. 3.

FIG. 4A is an enlarged plan view showing a portion of the first and second clock lines CKL1 and CKL2 shown in FIG. 3.

Referring to FIGS. 3 and 4A, the first and second clock lines CKL1 and CKL2 are arranged spaced apart from each other in a second direction DR2 substantially perpendicular to the first direction DR1.

A second main clock line MCKL2 and a branch line CKL2_b are arranged to be insulated from each other by an insulating layer (not shown) disposed between the second main clock line MCKL2 and the branch line CKL2_b, and the second main clock line MCKL2 and the branch line CKL2_b are connected to each other through a contact hole CNT.

The first clock line CKL1 includes a first main clock line MCKL1 extending in the first direction DR1 and a first dummy clock line DCKL1 extending in the first direction DR1 from the first main clock line MCKL1. The second clock line CKL2 includes the second main clock line MCKL2 extending in the first direction DR1 and a second dummy clock line DCKL2 extending in the first direction DR1 from the second main clock line MCKL2. Each of the first dummy clock line DCKL1 and the second dummy clock line DCKL2 may be arranged to have a portion in a spiral shape. Each of the first dummy clock line DCKL1 and the second dummy clock line DCKL2 has a line width smaller than that of the first main clock line MCKL1 and the second main clock line MCKL2, and thus the first dummy clock line DCKL1 and the second dummy clock line DCKL2 may be easily cut by a laser beam.

Figure 4B:
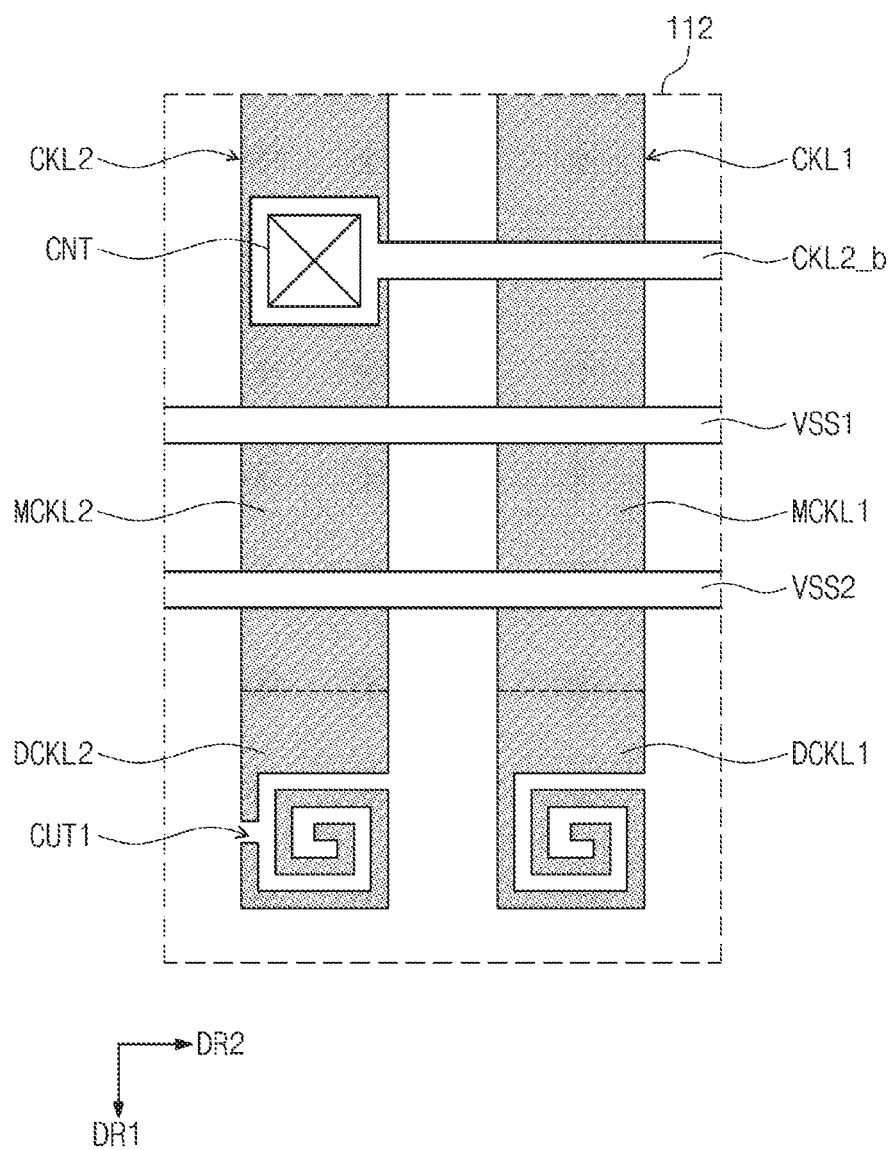
FIG. 4B is an enlarged plan view showing a portion of the first and second clock lines shown in FIG. 3.

FIG. 4B is an enlarged plan view showing a portion of the first and second clock lines shown in FIG. 3.

Referring to FIGS. 3 and 4B, the first and second clock signals CK1 and CK2 transmitted through the first and second clock lines CKL1 and CKL2 are required to have the same pulse width, amplitude, rising time, and falling time as each other, but have different phases from each other.

Accordingly, when a circuit is designed, it needs to be considered that a capacitance and/or a resistance of the first clock line CKL1 matches a capacitance and/or a resistance of the second clock lines CKL2 by allowing the first and second clock lines CKL1 and CKL2 to have the same line width and length.

However, the capacitance and/or the resistance of the first clock line CKL1 may not match the capacitance and/or the resistance of the second clock lines CKL2 due to various reasons. This causes a difference in operation timing between the driving stages SRC1 to SRCn, and thus a display quality is deteriorated, for example, a horizontal line occurs.

As described above, in the case that the capacitance and/or the resistance of the first clock line CKL1 do/does not match the capacitance and/or the resistance of the second clock lines CKL2, at least one of the first dummy clock line DCKL1 and the second dummy clock line DCKL2 is cut by a laser cutting process.

In the exemplary embodiment shown in FIG. 4B, if the capacitance of the second clock line CKL2 is greater than the capacitance of the first clock line CKL1, the second dummy clock line DCKL2 of the second clock line CKL2 is cut by the laser cutting process. A cutting point CUT1 may be determined depending on a difference in capacitance and/or resistance between the first and second clock lines CKL1 and CKL2. Due to the cutting of the second dummy clock line DCKL2, the first dummy clock line DCKL1 and the second dummy clock line DCKL2 have different areas, e.g., the first dummy clock line DCKL1 may have a smaller total area than the second dummy clock DCKL2 due to the area removed from the cutting point CUT1. Accordingly, the difference in capacitance and/or resistance between the first and second clock lines CKL1 and CKL2 may be compensated.

Figure 4C:
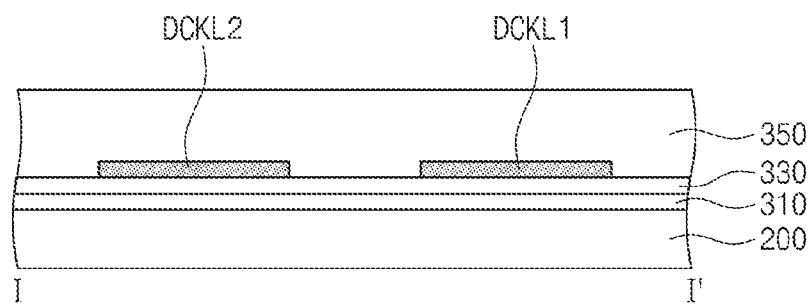
FIG. 4C is a cross-sectional view taken along a line I-I' shown in FIG. 4A.

FIG. 4C is a cross-sectional view taken along a line I-I' shown in FIG. 4A.

Referring to FIG. 4C, the buffer layer 310 is disposed on the substrate 200, and the gate insulating layer 330 is disposed on the buffer layer 310. The first dummy clock line DCKL1 and the second dummy clock line DCKL2 are disposed on the gate insulating layer 330 and spaced apart from each other by a predetermined distance. The interlayer insulating layer 350 is disposed on the first and second dummy clock lines DCKL1 and DCKL2. The interlayer insulating layer 350 entirely covers an upper surface of the first and second dummy clock lines DCKL1 and DCKL2.

The buffer layer 310, the gate insulating layer 330, and the interlayer insulating layer 350 include the same materials as, are formed through the same processes as, and are disposed on the same layers as those of the buffer layer 310, the gate insulating layer 330, and the interlayer insulating layer 350 shown in FIG. 2. The first dummy clock line DCKL1 and the second dummy clock line DCKL2 include the same materials as, are formed through the same processes as, and are disposed on the same layers as those of the gate electrode 340 shown in FIG. 2. According to another embodiment, the buffer layer 310, the gate insulating layer 330, and the interlayer insulating layer 350 may include a different material from and may be disposed on a different layer from those of the buffer layer 310, the gate insulating layer 330, and the interlayer insulating layer 350 shown in FIG. 2.

The first main clock line MCKL1, the first dummy clock line DCKL1, the second main clock line MCKL2, and the second dummy clock line DCKL2 shown in FIG. 4A may include the same materials as, may be formed through the same processes as, and may be disposed on the same layers as those of the gate electrode 340 shown in FIG. 2. According to another embodiment, the first main clock line MCKL1, the first dummy clock line DCKL1, the second main clock line MCKL2, and the second dummy clock line DCKL2 may include a different material from and may be disposed on a different layer from the gate electrode 340 shown in FIG. 2.

Figure 5A:
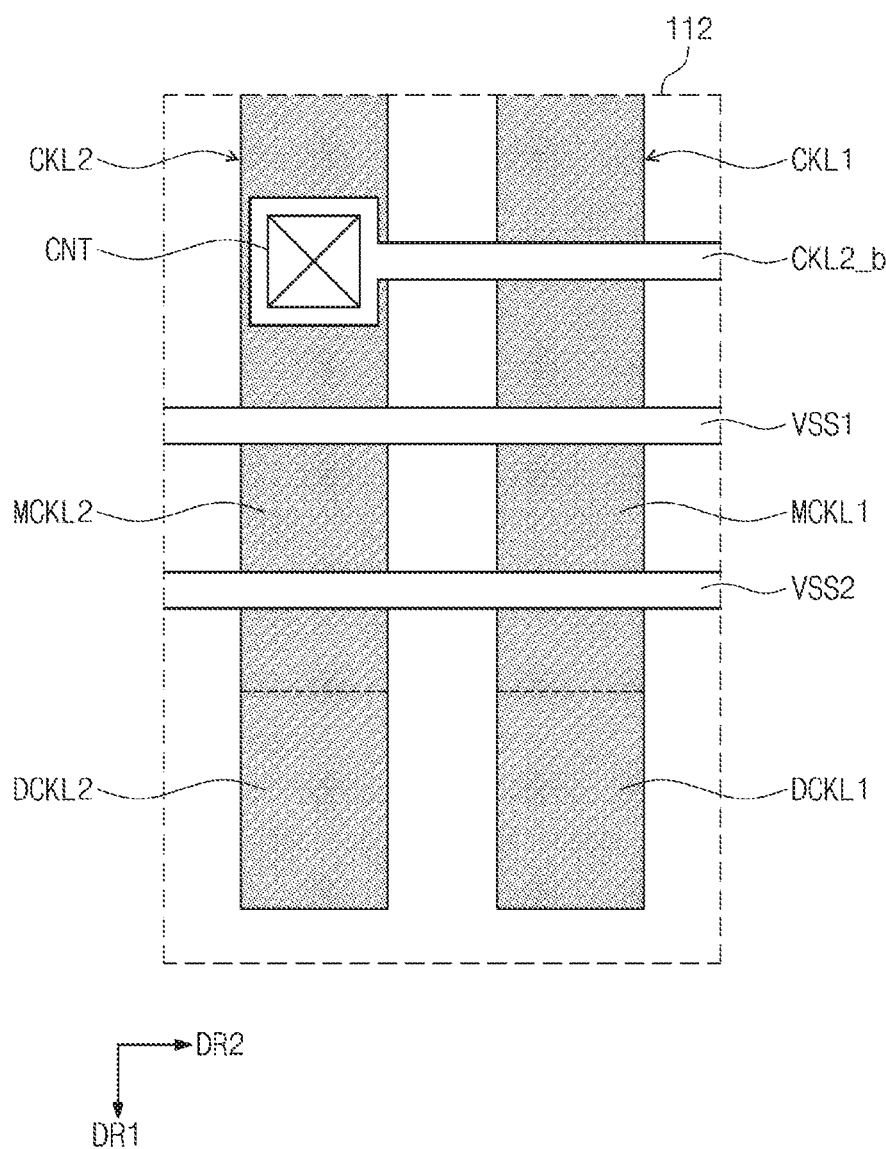
FIGS. 5A and 5B are enlarged plan views showing a portion of first and second clock lines according to another exemplary embodiment of the present disclosure.
Figure 5B:
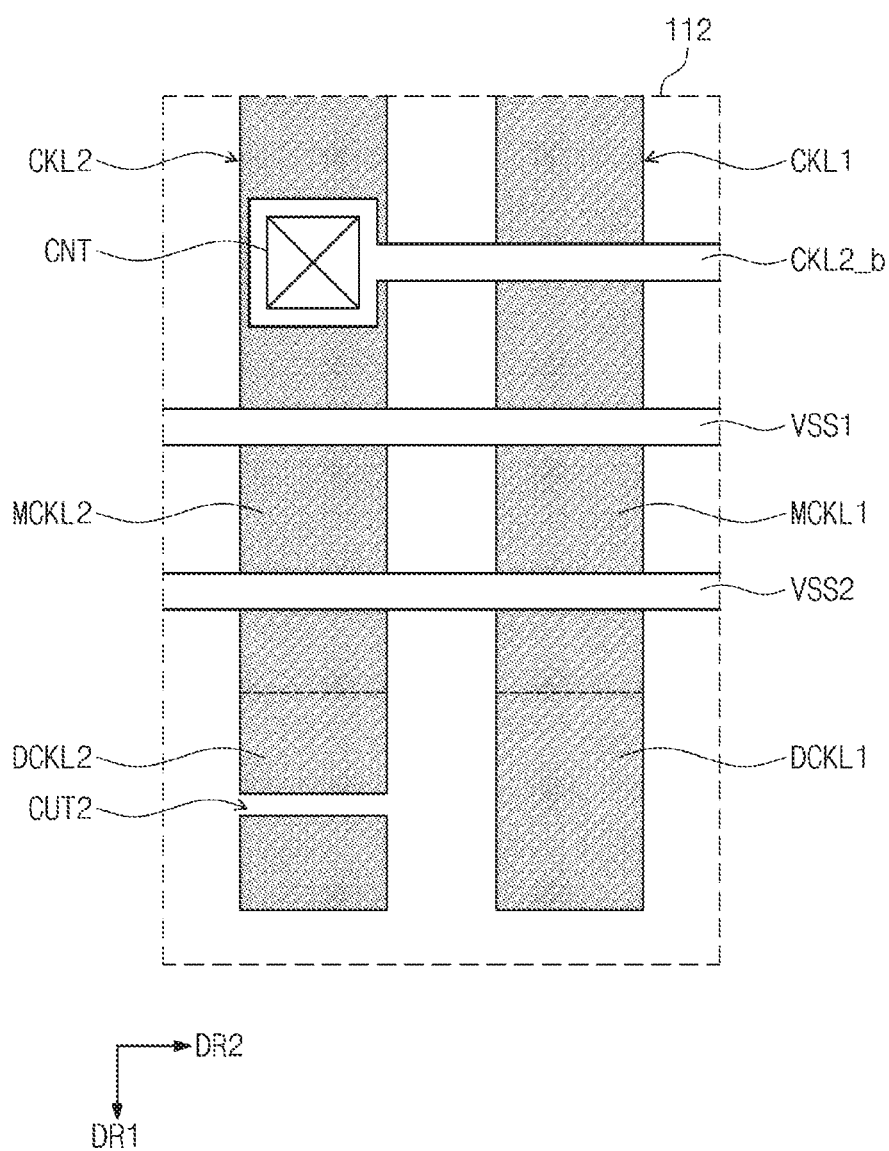

FIGS. 5A and 5B are enlarged plan views showing a portion of first and second clock lines according to another exemplary embodiment of the present disclosure.

Referring to FIGS. 5A and 5B, a first clock line CKL1 includes a first main clock line MCKL1 extending in the first direction DR1 and a first dummy clock line DCKL1 extending in the first direction DR1 from the first main clock line MCKL1. A second clock line CKL2 includes a second main clock line MCKL2 extending in the first direction DR1 and a second dummy clock line DCKL2 extending in the first direction DR1 from the second main clock line MCKL2. The first dummy clock line DCKL1 has the same line width as that of the first main clock line MCKL1, and the second dummy clock line DCKL2 has the same line width as that of the second main clock line MCKL2.

In the exemplary embodiment shown in FIG. 5B, the second dummy clock line DCKL2 of the second clock line CKL2 is cut by the laser cutting process. A cutting point CUT2 may be determined depending on a difference in capacitance and/or resistance between the first and second clock lines CKL1 and CKL2. Due to the cutting of the second dummy clock line DCKL2, the first dummy clock line DCKL1 and the second dummy clock line DCKL2 have different areas. Accordingly, the difference in capacitance and/or resistance between the first and second clock lines CKL1 and CKL2 may be compensated.

Figure 6A:
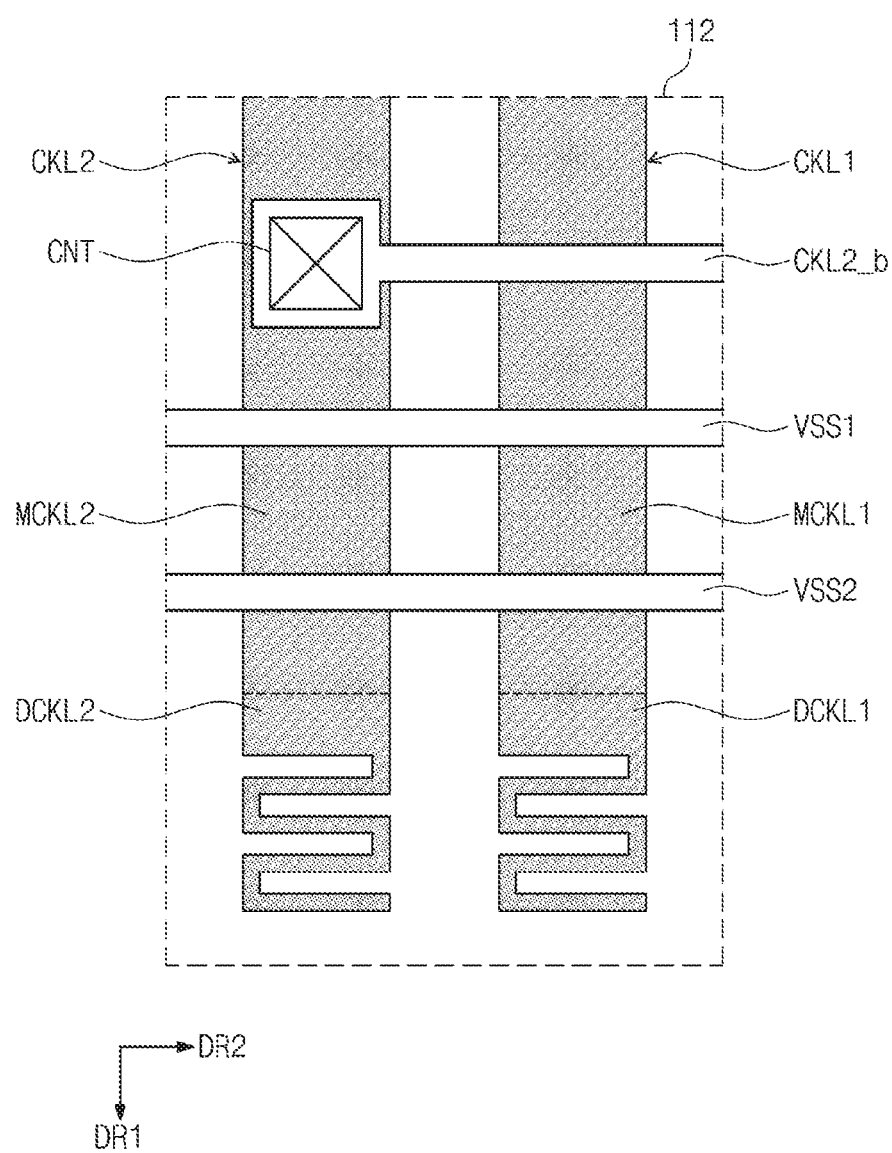
FIGS. 6A and 6B are enlarged plan views showing a portion of first and second clock lines according to another exemplary embodiment of the present disclosure.
Figure 6B:
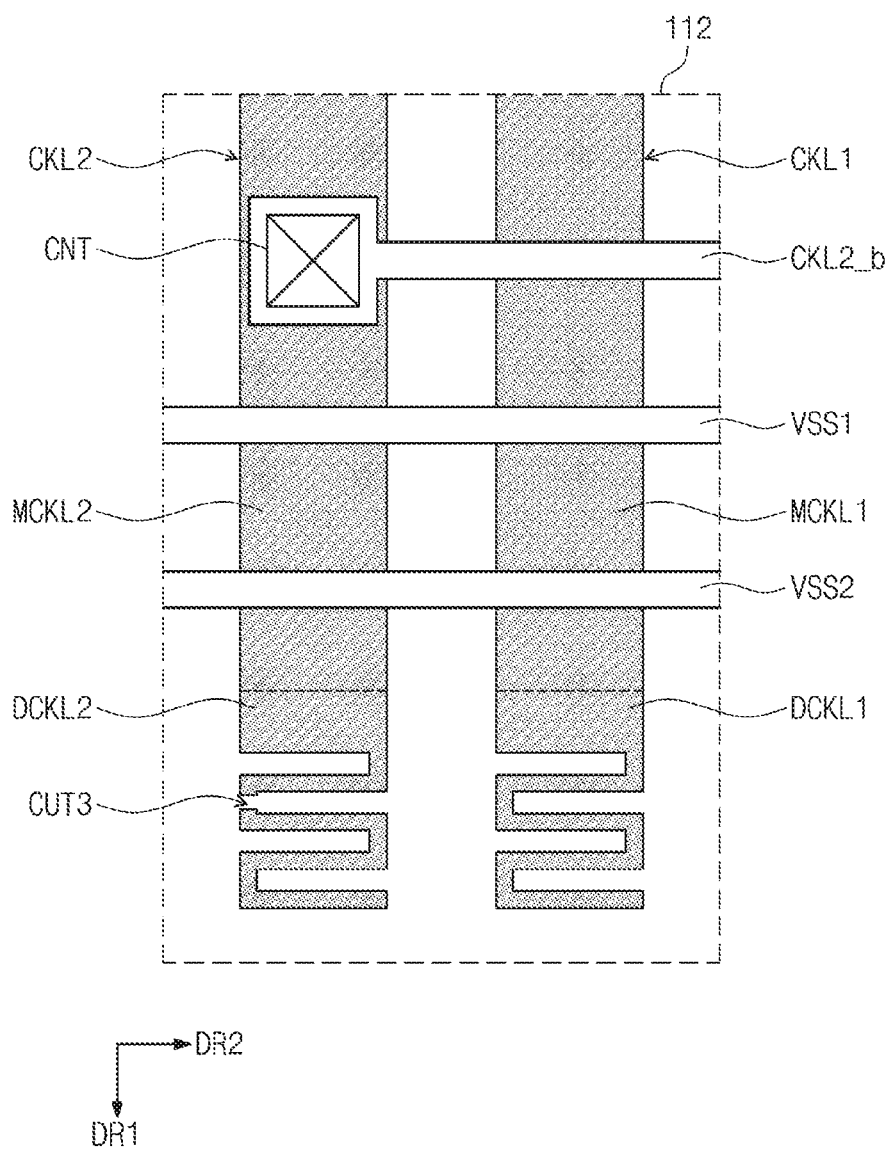

FIGS. 6A and 6B are enlarged plan views showing a portion of first and second clock lines according to another exemplary embodiment of the present disclosure.

Referring to FIGS. 6A and 6B, a first clock line CKL1 includes a first main clock line MCKL1 extending in the first direction DR1 and a first dummy clock line DCKL1 extending in the first direction DR1 from the first main clock line MCKL1. A second clock line CKL2 includes a second main clock line MCKL2 extending in the first direction DR1 and a second dummy clock line DCKL2 extending in the first direction DR1 from the second main clock line MCKL2.

Each of the first dummy clock line DCKL1 and the second dummy clock line DCKL2 may have a portion which is arranged in a zigzag shape. Each of the first dummy clock line DCKL1 and the second dummy clock line DCKL2 has a line width smaller than that of the first main clock line MCKL1 and the second main clock line MCKL2, and thus the first dummy clock line DCKL1 and the second dummy clock line DCKL2 may be easily cut by a laser beam.

In the exemplary embodiment shown in FIG. 6B, the second dummy clock line DCKL2 of the second clock line CKL2 is cut by the laser cutting process. A cutting point CUT3 may be determined depending on a difference in capacitance and/or resistance between the first and second clock lines CKL1 and CKL2. Due to the cutting of the second dummy clock line DCKL2, the first dummy clock line DCKL1 and the second dummy clock line DCKL2 have different areas. Accordingly, the difference in capacitance and/or resistance between the first and second clock lines CKL1 and CKL2 may be compensated.

Figure 7A:
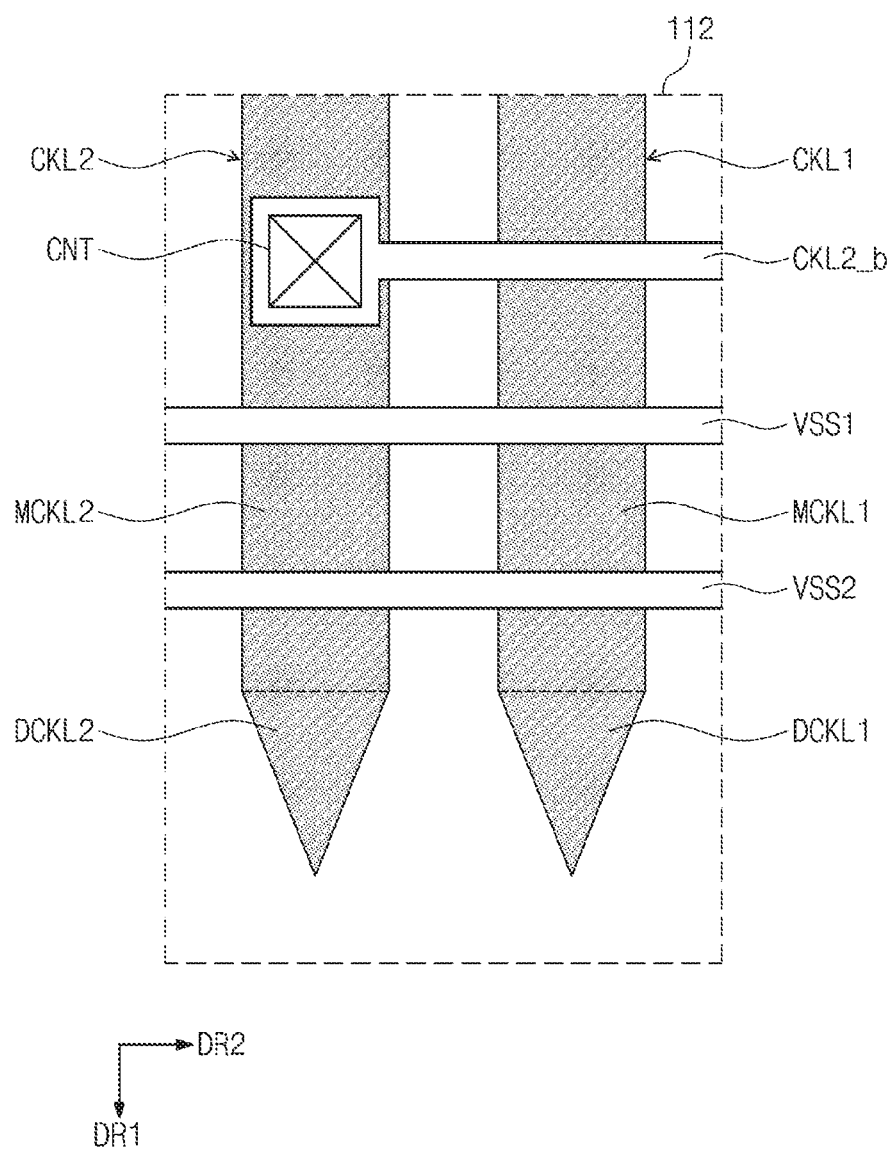
FIGS. 7A and 7B are enlarged plan views showing a portion of first and second clock lines according to another exemplary embodiment of the present disclosure.
Figure 7B:
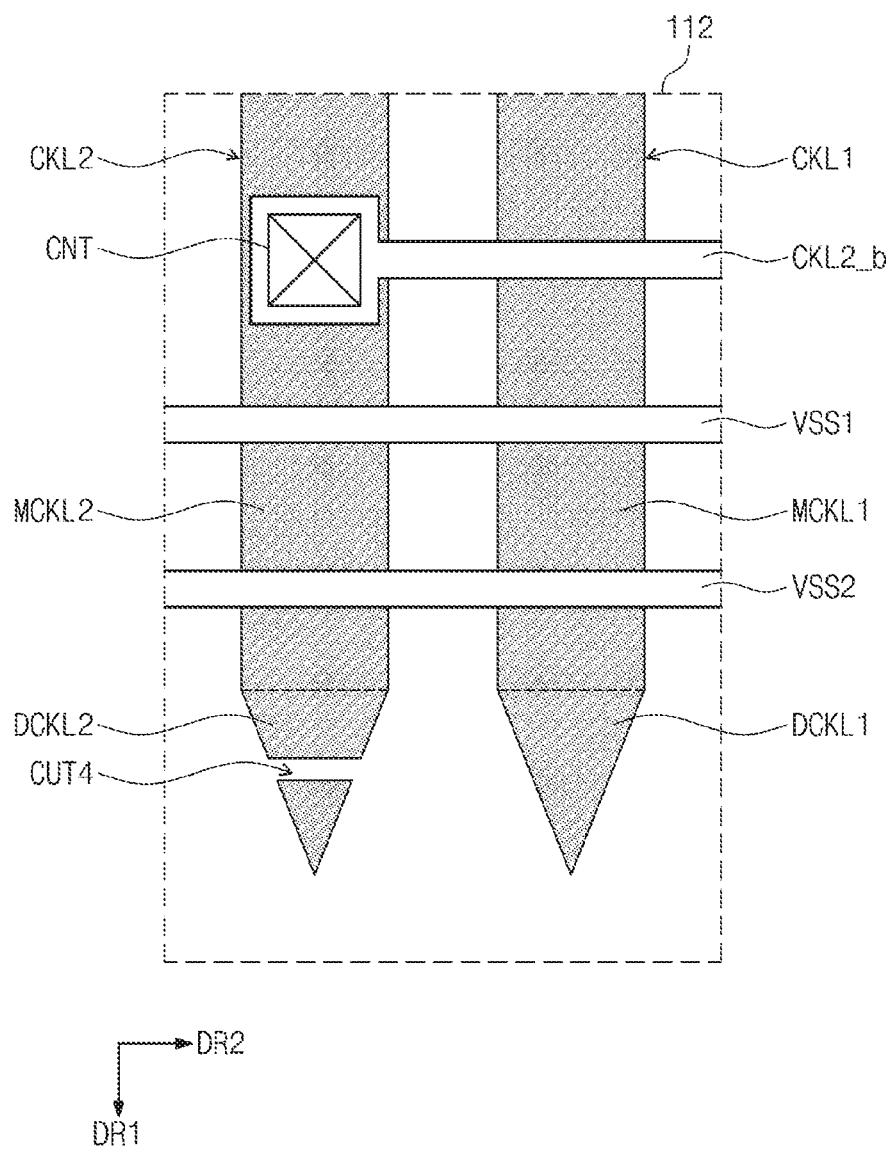

FIGS. 7A and 7B are enlarged plan views showing a portion of first and second clock lines according to another exemplary embodiment of the present disclosure.

Referring to FIGS. 7A and 7B, a first clock line CKL1 includes a first main clock line MCKL1 extending in the first direction DR1 and a first dummy clock line DCKL1 extending in the first direction DR1 from the first main clock line MCKL1. A second clock line CKL2 includes a second main clock line MCKL2 extending in the first direction DR1 and a second dummy clock line DCKL2 extending in the first direction DR1 from the second main clock line MCKL2.

Each of the first dummy clock line DCKL1 and the second dummy clock line DCKL2 may be arranged in a polygonal shape. As shown in FIGS. 7A and 7B, each of the first dummy clock line DCKL1 and the second dummy clock line DCKL2 may have a triangular shape.

In the exemplary embodiment shown in FIG. 7B, the second dummy clock line DCKL2 of the second clock line CKL2 is cut by the laser cutting process. A cutting point CUT4 may be determined depending on a difference in capacitance and/or resistance between the first and second clock lines CKL1 and CKL2. Due to the cutting of the second dummy clock line DCKL2, the first dummy clock line DCKL1 and the second dummy clock line DCKL2 have different areas from each other. Accordingly, the difference in capacitance and/or resistance between the first and second clock lines CKL1 and CKL2 may be compensated.

Figure 8A:
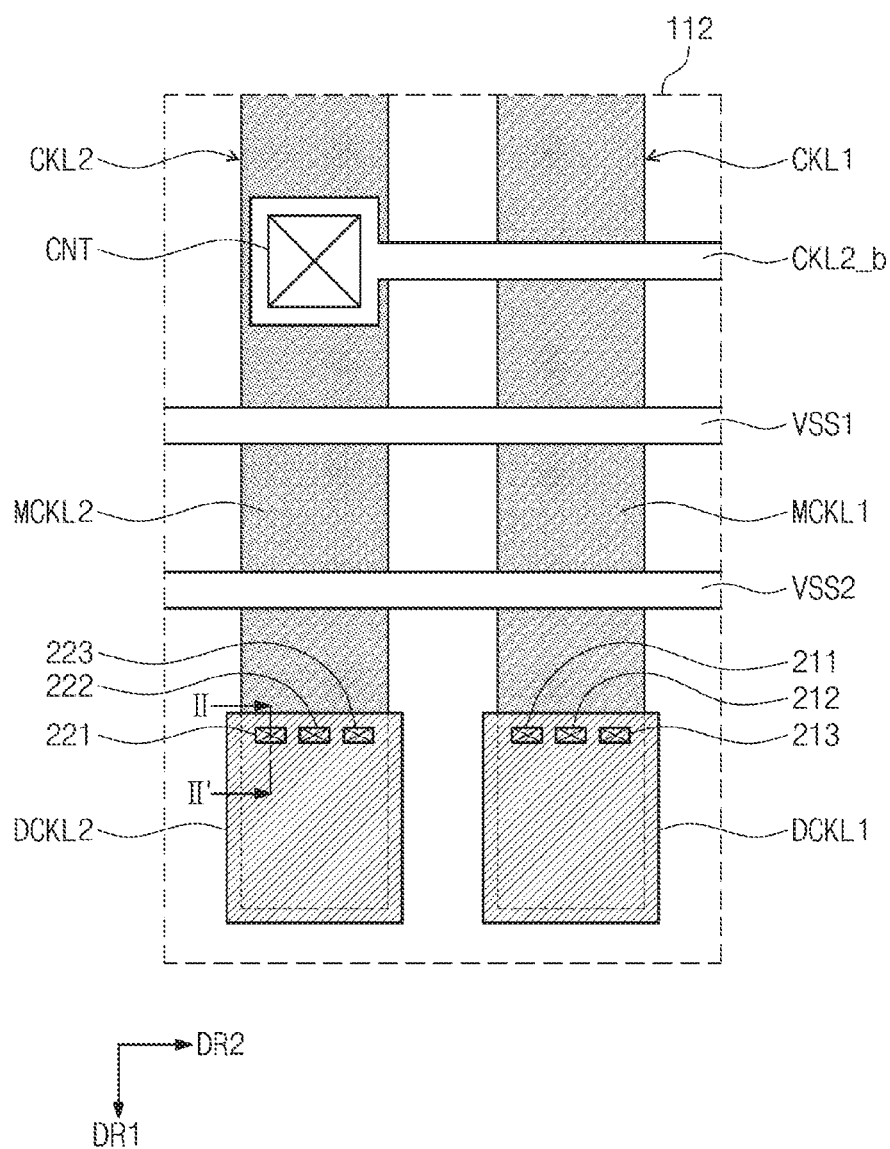
FIGS. 8A and 8B are enlarged plan views showing a portion of first and second clock lines according to another exemplary embodiment of the present disclosure.
Figure 8B:
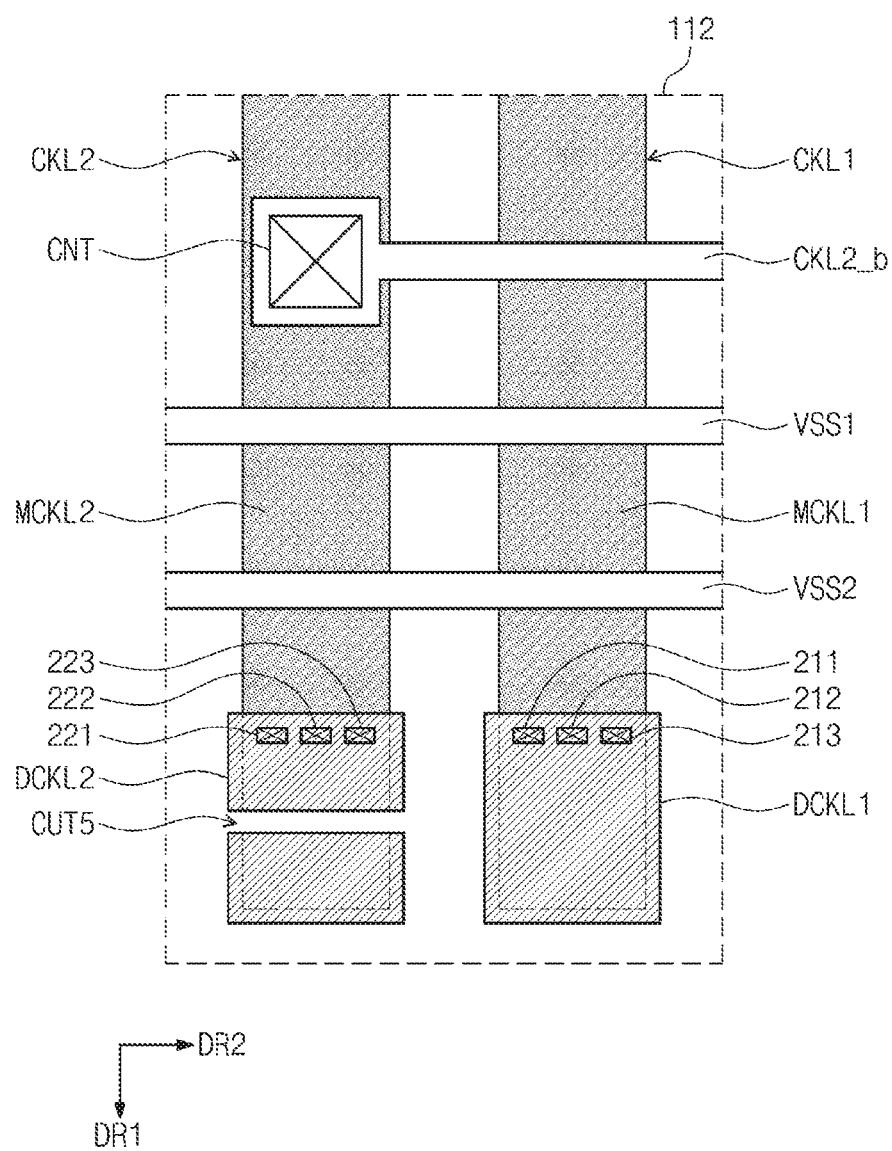

FIGS. 8A and 8B are enlarged plan views showing a portion of first and second clock lines according to another exemplary embodiment of the present disclosure.

Referring to FIGS. 8A and 8B, a first clock line CKL1 includes a first main clock line MCKL1 extending in the first direction DR1 and a first dummy clock line DCKL1 extending in the first direction DR1. The first main clock line MCKL1 and the first dummy clock line DCKL1 are disposed on different layers from each other and electrically connected to each other through contact holes 211, 212, and 213.

A second clock line CKL2 includes a second main clock line MCKL2 extending in the first direction DR1 and a second dummy clock line DCKL2 extending in the first direction DR1. The second main clock line MCKL2 and the second dummy clock line DCKL2 are disposed on different layers from each other and electrically connected to each other through contact holes 221, 222, and 223.

In the exemplary embodiment shown in FIG. 8B, the second dummy clock line DCKL2 of the second clock line CKL2 is cut by the laser cutting process. A cutting point CUT5 may be determined depending on a difference in capacitance and/or resistance between the first and second clock lines CKL1 and CKL2. Due to the cutting of the second dummy clock line DCKL2, the first dummy clock line DCKL1 and the second dummy clock line DCKL2 have different areas from each other. Accordingly, the difference in capacitance and/or resistance between the first and second clock lines CKL1 and CKL2 may be compensated.

In the exemplary embodiment shown in FIG. 8B, the first dummy clock line DCKL1 has the same line width as that of the first main clock line MCKL1, and the second dummy clock line DCKL2 has the same line width as that of the second main clock line MCKL2. According to another embodiment, the first dummy clock line DCKL1 and the second dummy clock line DCKL2 may have one or a combination of the spiral shape shown in FIGS. 4A and 4B, the zigzag shape shown in FIGS. 6A and 6B, and the polygonal shape shown in FIGS. 7A and 7B.

Figure 8C:
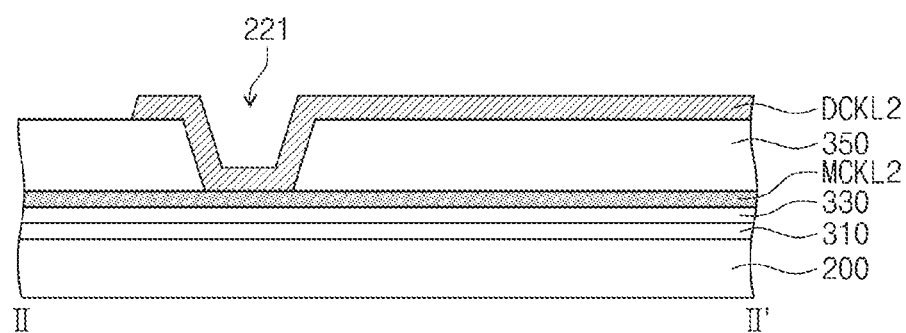
FIG. 8C is a cross-sectional view taken along a line II-II' shown in FIG. 8A.

FIG. 8C is a cross-sectional view taken along a line II-II' shown in FIG. 8A.

Referring to FIG. 8C, a buffer layer 310 is disposed on a substrate 200, and a gate insulating layer 330 is disposed on the buffer layer 310. The second main clock line MCKL2 is disposed on the gate insulating layer 330. An interlayer insulating layer 350 is disposed on the second main clock line MCKL2. The interlayer insulating layer 350 entirely covers an upper surface of the second main clock line MCKL2.

The buffer layer 310, the gate insulating layer 330, and the interlayer insulating layer 350 include the same materials as, are formed through the same processes as, and are disposed on the same layers as those of the buffer layer 310, the gate insulating layer 330, and the interlayer insulating layer 350 shown in FIG. 2. The second main clock line MCKL2 includes the same material as, is formed through the same process as, and is disposed on the same layer as those of the gate electrode 340 shown in FIG. 2.

The interlayer insulating layer 350 is provided with the contact hole 221 defined therethrough to expose a portion of the second main clock line MCKL2. The second dummy clock line DCKL2 is disposed on the interlayer insulating layer 350. The second dummy clock line DCKL2 makes contact with the second main clock line MCKL2 through the contact hole 221. The second dummy clock line DCKL2 includes the same material as, is formed through the same process as, and is disposed on the same layer as those of the source electrode 341 and the drain electrode 342 shown in FIG. 2.

According to another embodiment, the second dummy clock line DCKL2 may include the same material as, may be formed through the same process as, and may be disposed on the same layer as those of the pixel electrode 372 shown in FIG. 2.

Figure 9A:
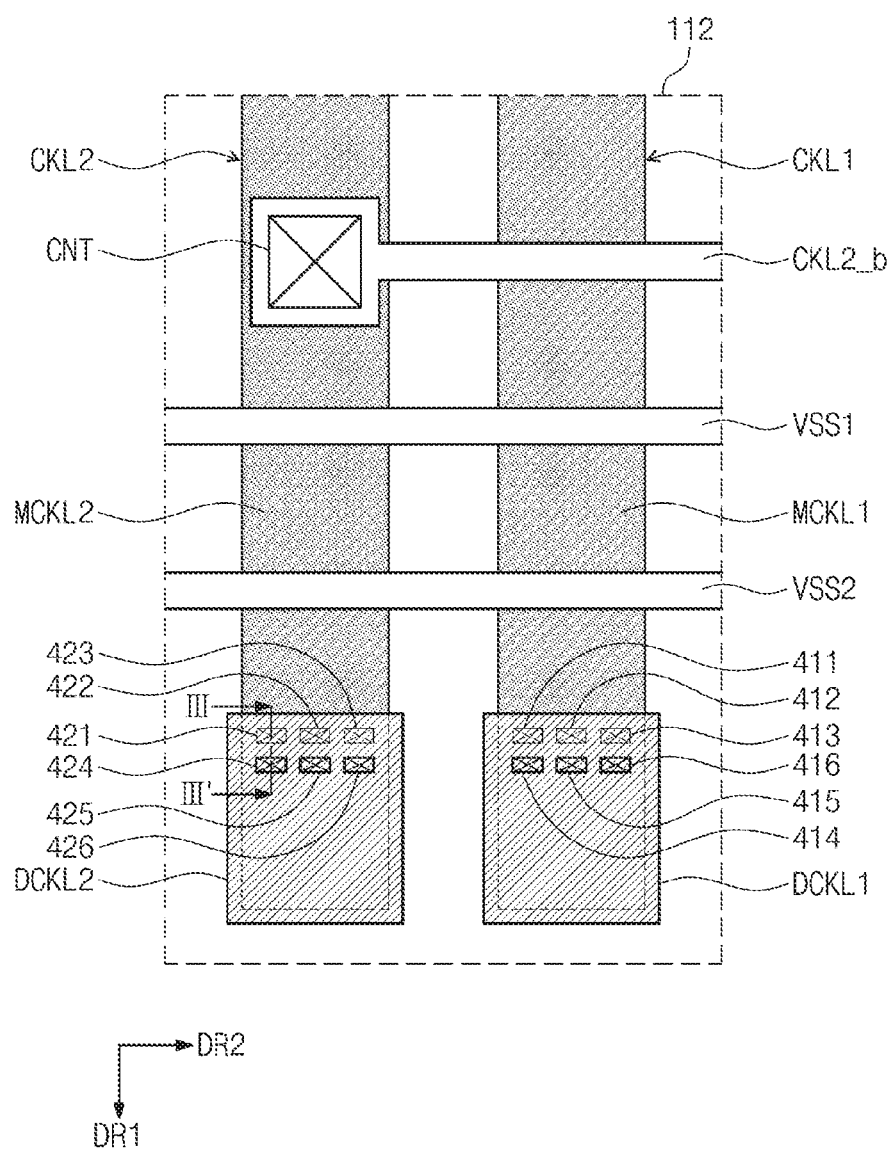
FIGS. 9A and 9B are enlarged plan views showing a portion of first and second clock lines according to another exemplary embodiment of the present disclosure.
Figure 9B:
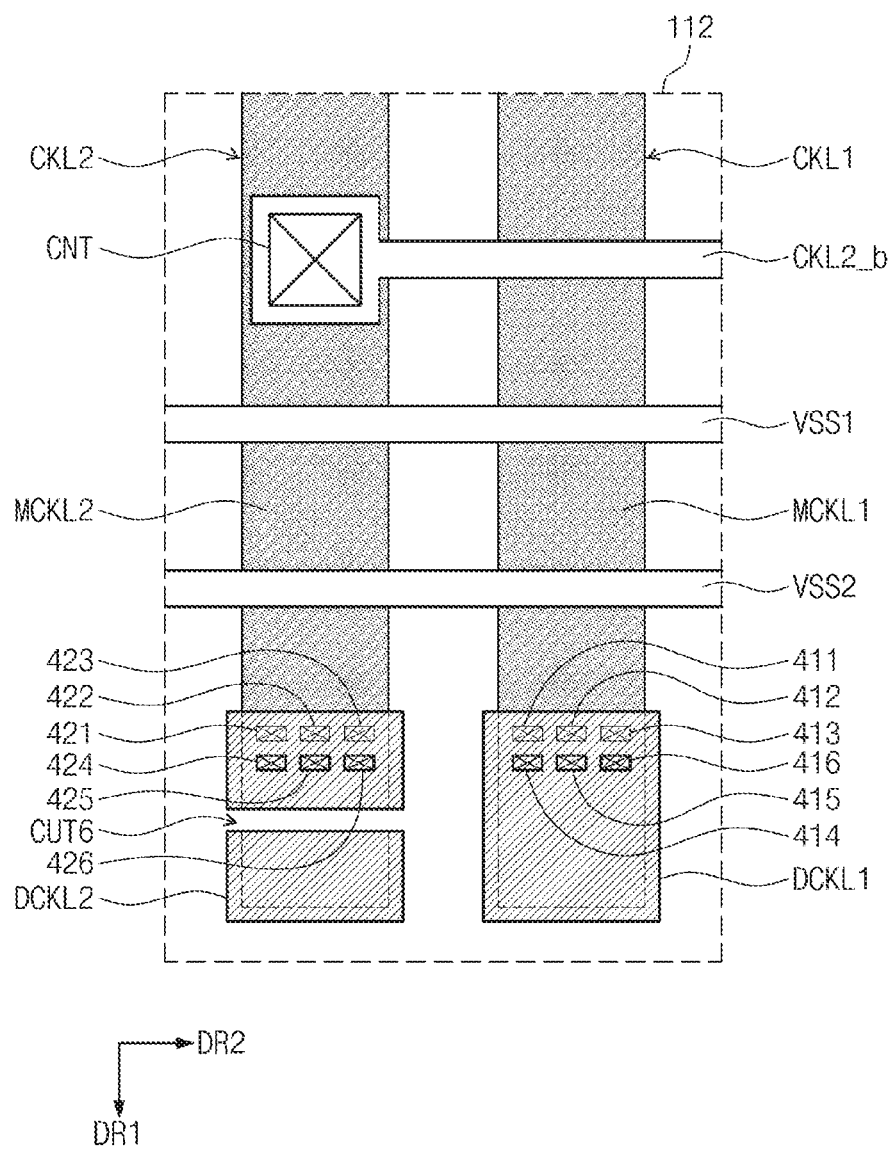

FIGS. 9A and 9B are enlarged plan views showing a portion of first and second clock lines according to another exemplary embodiment of the present disclosure.

Referring to FIGS. 9A and 9B, a first clock line CKL1 includes a first main clock line MCKL1 extending in the first direction DR1 and a first dummy clock line DCKL1 extending in the first direction DR1. The first main clock line MCKL1 and the first dummy clock line DCKL1 are disposed on different layers from each other and electrically connected to each other through contact holes 411, 412, 413, 414, 415, and 416.

A second clock line CKL2 includes a second main clock line MCKL2 extending in the first direction DR1 and a second dummy clock line DCKL2 extending in the first direction DR1. The second main clock line MCKL2 and the second dummy clock line DCKL2 are disposed on different layers from each other and electrically connected to each other through contact holes 421, 422, 423, 424, 425, and 426.

In the exemplary embodiment shown in FIG. 9B, the second dummy clock line DCKL2 of the second clock line CKL2 is cut by the laser cutting process. A cutting point CUT6 may be determined depending on a difference in capacitance and/or resistance between the first and second clock lines CKL1 and CKL2. Due to the cutting of the second dummy clock line DCKL2, the first dummy clock line DCKL1 and the second dummy clock line DCKL2 have different areas from each other. Accordingly, the difference in capacitance and/or resistance between the first and second clock lines CKL1 and CKL2 may be compensated.

In the exemplary embodiment shown in FIG. 9B, the first dummy clock line DCKL1 has the same line width as that of the first main clock line MCKL1, and the second dummy clock line DCKL2 has the same line width as that of the second main clock line MCKL2. According to another embodiment, the first dummy clock line DCKL1 and the second dummy clock line DCKL2 may have one or a combination of the spiral shape shown in FIGS. 4A and 4B, the zigzag shape shown in FIGS. 6A and 6B, and the polygonal shape shown in FIGS. 7A and 7B.

Figure 9C:
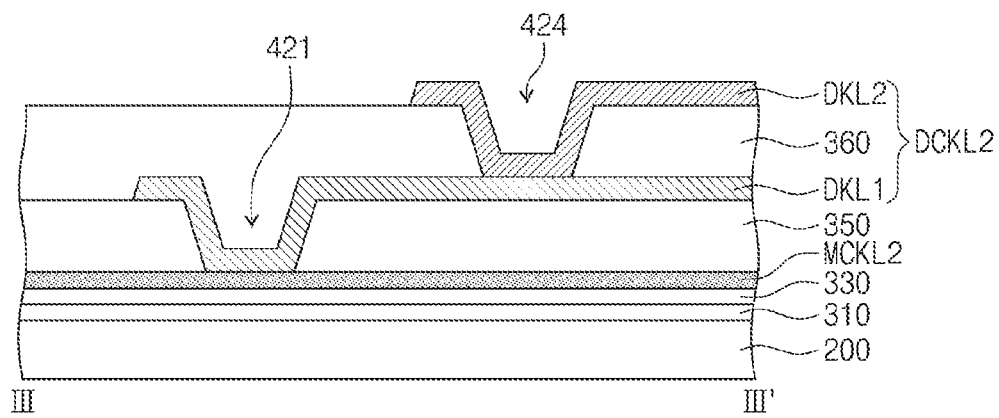
FIG. 9C is a cross-sectional view taken along a line shown in FIG. 9A.

FIG. 9C is a cross-sectional view taken along a line shown in FIG. 9A.

Referring to FIG. 9C, a buffer layer 310 is disposed on a substrate 200, and a gate insulating layer 330 is disposed on the buffer layer 310. The second main clock line MCKL2 is disposed on the gate insulating layer 330. An interlayer insulating layer 350 is disposed on the second main clock line MCKL2. The interlayer insulating layer 350 entirely covers an upper surface of the second main clock line MCKL2.

The buffer layer 310, the gate insulating layer 330, and the interlayer insulating layer 350 include the same materials as, are formed through the same processes as, and are disposed on the same layers as those of the buffer layer 310, the gate insulating layer 330, and the interlayer insulating layer 350 shown in FIG. 2. The second main clock line MCKL2 includes the same material as, is formed through the same process as, and is disposed on the same layer as those of the gate electrode 340 shown in FIG. 2.

The second dummy clock line DCKL2 includes a first dummy line DKL1 and a second dummy line DKL2.

The interlayer insulating layer 350 is provided with the contact hole 421 defined therethrough to expose a portion of the second main clock line MCKL2. The first dummy line DKL1 is disposed on the interlayer insulating layer 350. The first dummy line DKL1 makes contact with the second main clock line MCKL2 through the contact hole 421. The first dummy line DKL1 includes the same material as, is formed through the same process as, and is disposed on the same layer as those of the source electrode 341 and the drain electrode 342 shown in FIG. 2.

A protective layer 360 is disposed on the first dummy line DKL1. The protective layer 360 entirely covers an upper surface of the second clock line CKL2. The protective layer 360 is provided with the contact hole 424 defined therethrough to expose a portion of the first dummy line DKL1. The second dummy line DKL2 is disposed on the protective layer 360. The second dummy line DKL2 makes contact with the first dummy line DKL1 through the contact hole 424. The second dummy line DKL2 includes the same material as, is formed through the same process as, and is disposed on the same layer as those of the pixel electrode 372 shown in FIG. 2.

According to another embodiment, the second dummy line DKL2 may be disposed above the first dummy line DKL1 without disposing the protective layer 360 on the first dummy line DKL1.

Figure 10A:
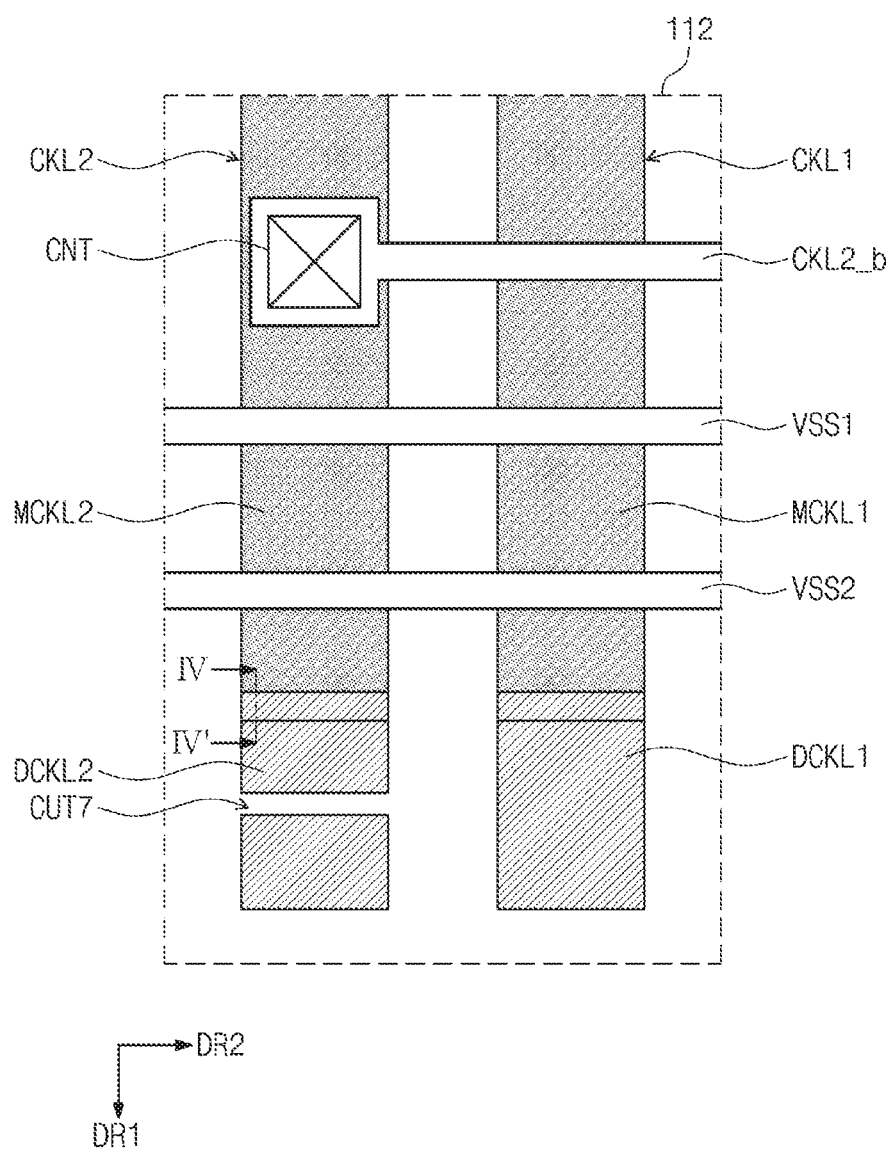
FIG. 10A is an enlarged plan view showing a portion of first and second clock lines according to another exemplary embodiment of the present disclosure.

FIG. 10A is an enlarged plan view showing a portion of first and second clock lines according to another exemplary embodiment of the present disclosure.

Referring to FIG. 10A, a first clock line CKL1 includes a first main clock line MCKL1 extending in the first direction DR1 and a first dummy clock line DCKL1 extending in the first direction DR1. A second clock line CKL2 includes a second main clock line MCKL2 extending in the first direction DR1 and a second dummy clock line DCKL2 extending in the first direction DR1. The first dummy clock line DCKL1 has the same line width as that of the first main clock line MCKL1, and the second dummy clock line DCKL2 has the same line width as that of the second main clock line MCKL2.

In the exemplary embodiment shown in FIG. 10A, the second dummy clock line DCKL2 of the second clock line CKL2 is cut by the laser cutting process. A cutting point CUT7 may be determined depending on a difference in capacitance and/or resistance between the first and second clock lines CKL1 and CKL2. Due to the cutting of the second dummy clock line DCKL2, the first dummy clock line DCKL1 and the second dummy clock line DCKL2 have different areas. Accordingly, the difference in capacitance and/or resistance between the first and second clock lines CKL1 and CKL2 may be compensated.

Figure 10B:
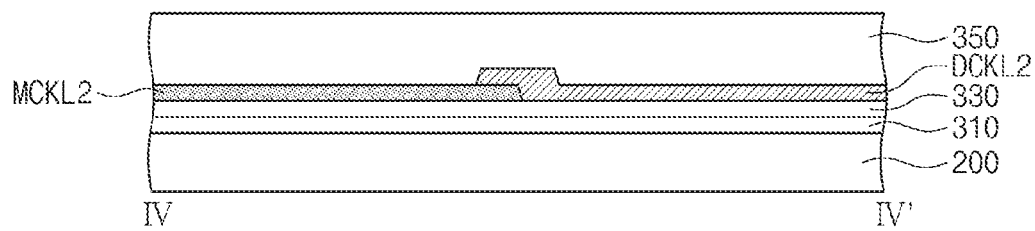
FIG. 10B is a cross-sectional view taken along a line IV-IV' shown in FIG. 10A.

FIG. 10B is a cross-sectional view taken along a line IV-IV' shown in FIG. 10A.

Referring to FIG. 10B, a buffer layer 310 is disposed on a substrate 200, and a gate insulating layer 330 is disposed on the buffer layer 310. The second main clock line MCKL2 is disposed on the gate insulating layer 330. The second main clock line MCKL2 includes the same material as, is formed through the same process as, and is disposed on the same layer as those of the gate electrode 340 shown in FIG. 2. The second dummy clock line DCKL2 is disposed to partially overlap with the second main clock line MCKL2. The second dummy clock line DCKL2 includes the same material as, is formed through the same process as, and is disposed on the same layer as those of the source electrode 341 and the drain electrode 342 shown in FIG. 2.

An interlayer insulating layer 350 is disposed on the second main clock line MCKL2 and the second dummy clock line DCKL2. The interlayer insulating layer 350 entirely covers upper surfaces of the second main clock line MCKL2 and the second dummy clock line DCKL2.

The buffer layer 310, the gate insulating layer 330, and the interlayer insulating layer 350 may include the same materials as, may be formed through the same processes as, and may be disposed on the same layers as those of the buffer layer 310, the gate insulating layer 330, and the interlayer insulating layer 350 shown in FIG. 2.

According to another embodiment, the second dummy clock line DCKL2 may include the same material as, may be formed through the same process as, and may be disposed on the same layer as those of the pixel electrode 372 shown in FIG. 2.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
   a display panel comprising a display area and a non-display area, the display area comprising a plurality of pixels;
   a gate driving circuit disposed in the non-display area and configured to apply a plurality of gate signals to the pixels to drive the pixels;
   a first clock line disposed in the non-display area and configured to apply a first clock signal to the gate driving circuit; and
   a second clock line disposed in the non-display area and configured to apply a second clock signal to the gate driving circuit, wherein the first clock line comprises a first main clock line and a first dummy clock line extending from the first main clock line, the second clock line comprises a second main clock line and a second dummy clock line extending from the second main clock line, and the first dummy clock line and the second dummy clock line have different areas from each other, wherein the first main clock line, the first dummy clock line, the second main clock line, and the second dummy clock line are substantially simultaneously formed using a same material.

2. The display apparatus of claim 1, wherein at least one of the first dummy clock line and the second dummy clock line is cut by a laser cutting process such that the first dummy clock line and the second dummy clock line have different areas from each other.

3. The display apparatus of claim 1, wherein the first main clock line extends in a first direction, the first dummy clock line extends in the first direction from the first main clock line, the second main clock line extends in the first direction, and the second dummy clock line extends in the first direction from the second main clock line.

4. The display apparatus of claim 3, wherein the first clock line and the second clock line are arranged in a second direction substantially perpendicular to the first direction and spaced apart from each other by a predetermined distance.

5. The display apparatus of claim 1, wherein at least a portion of each of the first dummy clock line and the second dummy clock line has a spiral shape.

6. The display apparatus of claim 5, wherein each of the first dummy clock line and the second dummy clock line has a line width smaller than a line width of the first main clock line and the second main clock line.

7. The display apparatus of claim 1, wherein at least a portion of each of the first dummy clock line and the second dummy clock line has one or a combination of a spiral shape, a polygonal shape, a circular shape, and a zigzag shape.

8. The display apparatus of claim 1, wherein each of the pixels comprises:
a substrate;
a semiconductor layer disposed on the substrate;
a gate insulating layer covering the semiconductor layer;
a gate electrode disposed on the gate insulating layer;
an interlayer insulating layer disposed on the gate electrode;
a source electrode disposed on the interlayer insulating layer; and
a drain electrode disposed on the interlayer insulating layer.

9. The display apparatus of claim 8, wherein the first main clock line, the first dummy clock line, the second main clock line, the second dummy clock line, and the gate electrode are formed on the substrate.

10. The display apparatus of claim 9, further comprising an insulating layer disposed on the first main clock line and the second main clock line, wherein the first main clock line and the second main clock line are disposed on the substrate, the first dummy clock line makes contact with the first main clock line through a first contact hole defined through the insulating layer, and the second dummy clock line makes contact with the second main clock line through a second contact hole defined through the insulating layer.

11. The display apparatus of claim 9, wherein the first dummy clock line, the second dummy clock line, the source electrode, and the drain electrode are formed substantially simultaneously using a same material.

12. The display apparatus of claim 9, further comprising:
an insulating layer disposed on the first main clock line and the second main clock line;
a first dummy line disposed on the insulating layer;
an interlayer insulating layer disposed on the first dummy line; and
a second dummy line disposed on the interlayer insulating layer, wherein the first main clock line and the second main clock line are disposed on the substrate, the first dummy line makes contact with the first main clock line through a first contact hole defined through the insulating layer, the second dummy line makes contact with the first dummy line through a second contact hole defined through the interlayer insulating layer, the first dummy clock line comprises the first dummy line and the second dummy line, and the second dummy clock line makes contact with the second main clock line through a third contact hole defined through the insulating layer.

13. The display apparatus of claim 12, wherein each of the pixels further comprises:
a protective layer covering the source electrode and the drain electrode; and
a pixel electrode disposed on the protective layer, the first dummy line is substantially simultaneously formed with the source electrode and the drain electrode of each of the pixels using a same material, and the second dummy line is substantially simultaneously formed with the pixel electrode of each of the pixels using a same material.

14. A display panel comprising:
a first clock line extending in a first direction and configured to provide a first clock signal; and
a second clock line extending in the first direction and configured to provide a second clock signal, wherein the first clock line comprises a first main clock line and a first dummy clock line extending from the first main clock line, the second clock line comprises a second main clock line and a second dummy clock line extending from the second main clock line, and the first dummy clock line and the second dummy clock line have different areas from each other, wherein the first main clock line, the second main clock line, the first dummy clock line, and the second dummy clock line are substantially simultaneously formed using a same material.

15. The display panel of claim 14, wherein each of the first dummy clock line and the second dummy clock line has a line width smaller than a line width of the first main clock line and the second main clock line.

16. The display panel of claim 14, wherein at least a portion of each of the first dummy clock line and the second dummy clock line has one or a combination of a spiral shape, a polygonal shape, a circular shape, and a zigzag shape.

17. The display panel of claim 14, further comprising:
a substrate; and
an insulating layer disposed on the first main clock line and the second main clock line, wherein the first main clock line and the second main clock line are disposed on the substrate, the first dummy clock line makes contact with the first main clock line through a first contact hole defined through the insulating layer, and the second dummy clock line makes contact with the second main clock line through a second contact hole defined through the insulating layer.

18. The display panel of claim 17, further comprising:
a substrate;
an insulating layer disposed on the first main clock line and the second main clock line;
a first dummy line disposed on the insulating layer;
an interlayer insulating layer disposed on the first dummy line; and
a second dummy line disposed on the interlayer insulating layer, wherein the first main clock line and the second main clock line are disposed on the substrate, the first dummy line makes contact with the first main clock line through a first contact hole defined through the insulating layer, the second dummy line makes contact with the first dummy line through a second contact hole defined through the interlayer insulating layer, the first dummy clock line comprises the first dummy line and the second dummy line, and the second dummy clock line makes contact with the second main clock line through a third contact hole defined through the insulating layer.

* * * * *